(12) United States Patent
Sekine et al.

(10) Patent No.: US 6,266,192 B1
(45) Date of Patent: Jul. 24, 2001

(54) PROJECTION EXPOSURE APPARATUS AND DEVICE MANUFACTURING METHOD

(75) Inventors: Yoshiyuki Sekine, Utsunomiya; Ryusho Hirose, Kawasaki, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/031,762

(22) Filed: Feb. 27, 1998

(30) Foreign Application Priority Data

Feb. 28, 1997 (JP) .................................................... 9-062239
Feb. 10, 1998 (JP) .................................................. 10-044563

(51) Int. Cl.[7] .............................. G02B 5/18; G02B 27/44; G03B 27/42; G03B 27/54
(52) U.S. Cl. ............................ 359/569; 359/566; 355/53; 355/67
(58) Field of Search ..................................... 359/565, 566, 359/569; 355/53, 67

(56) References Cited

U.S. PATENT DOCUMENTS

| | | | |
|---|---|---|---|
| 4,685,777 | 8/1987 | Hirose | 350/505 |
| 4,688,904 | 8/1987 | Hirose et al. | 350/443 |
| 4,701,035 | 10/1987 | Hirose | 350/505 |
| 5,044,706 | 9/1991 | Chen | 359/357 |
| 5,715,039 | * 2/1998 | Fukuda et al. | 355/53 |

FOREIGN PATENT DOCUMENTS

| | | |
|---|---|---|
| 4-213421 | 8/1992 | (JP) . |
| 6-324262 | 11/1994 | (JP) . |
| 6-331941 | 12/1994 | (JP) . |
| 7-128590 | 5/1995 | (JP) . |
| 8-17719 | 1/1996 | (JP) . |

OTHER PUBLICATIONS

A.D. Kathman, et al., "Binary Optics in Lens Design", SPIE, vol. 1354, International lens Design Conference (1990), pp. 297–309.

G.J. Swanson, Technical Report 854, MIT Lincoln Laboratory, "Binary Optics Technology: theoretical limits on the diffraction efficiency of multilevel diffractive optical elements", Aug. 1989, p. 1–47.

G.J. Swanson, Technical Report 914, MIT Lincoln Laboratory, "Binary Optics Technology: the theory and design of multi–level diffractive optical elements", Mar. 1991, p. 1–27.

* cited by examiner

Primary Examiner—Audrey Chang
(74) Attorney, Agent, or Firm—Fitzpatrick, Cella, Harper & Scinto

(57) ABSTRACT

A projection exposure apparatus includes an illumination optical system for illuminating a mask with light from a light source and a projection optical system having at least one diffractive optical element, for projecting an image of a pattern of the mask, as illuminated, onto a substrate. The at least one diffractive optical element is adapted to produce first diffraction light of an order to be used for projection of the image and second diffraction light of an order different from that of the first diffraction light. A portion of the second diffraction light is projected onto the substrate to provide a substantially uniform intensity distribution.

31 Claims, 25 Drawing Sheets

PROJECTION EXPOSURE APPARATUS AND DEVICE MANUFACTURING METHOD

FIELD OF THE INVENTION AND RELATED ART

This invention relates to a projection exposure apparatus and a device manufacturing method. Specifically, the invention is suitably usable in the manufacture of devices with patterns of a size on the order of submicron or quartermicron order or smaller, such as ICs, LSIs, CCDs or liquid crystal panels, for example, based on a projection optical system with a diffractive optical element for projecting and printing a device pattern of a reticle or mask (hereinafter "mask") on different regions on a wafer through a step-and-repeat procedure or step-and-scan procedure.

Many proposals have recently been made in relation to an optical system having a diffractive optical element. Examples are "SPIE, Vol. 1354, International Lens Design Conference (1990)", Japanese Laid-Open Patent Applications, Laid-Open No. 213421/1992, No. 324262/1994 and No. 331941/1994, and U.S. Pat. No. 5,044,706, wherein a phenomenon that chromatic aberration of a diffractive optical element is inverse to that of an ordinary refractive lens element is utilized and wherein a diffractive optical element having a positive optical power is formed on the surface of a lens or transparent plate to reduce the chromatic aberration of the optical system.

Further, proposals have been made with respect to a diffractive optical element called a "binary optics element" wherein the units constituting the element are defined by a step-structure of two levels or more. Examples are "G. J. Swanson, Technical Report 854, MIT Lincoln Laboratory, Aug. 14, 1989" and "G. J. Swanson, Technical Report 914, MIT Lincoln Laboratory, Mar. 1, 1991".

On the other hand, proposals have been made with respect to a projection exposure apparatus for the manufacture of semiconductor devices, which uses a diffractive optical element for correction of aberrations. Examples are Japanese Laid-Open Patent Applications, Laid-Open No. 331941/1994, No. 128590/1995 and No. 17719/1996. In these proposals, a projection optical system includes one or more diffractive optical elements mainly for correction of axial chromatic aberration or magnification chromatic aberration.

With respect to efficiency of the use of light, use of a phase type diffractive optical element may be preferable. In a phase type diffractive optical element, if its kinoform is defined idealistically, it shows a diffraction efficiency of 100%. In a binary optics element, as compared therewith, since its kinoform is defined by approximation with steps, it does not show a diffraction efficiency of 100% even though the element is formed idealistically. With a structure of eight steps, for example, a highest diffraction efficiency will be about 95%. Thus, diffraction light (unwanted diffraction light) not contributable to the imaging, will be produced. Such unwanted diffraction light is not correctly imaged at a desired position, and it produces flare light which reaches the image plane and deteriorates the image quality.

SUMMARY OF THE INVENTION

On an occasion when a diffractive optical element produces unwanted diffraction light such as described above, there are two possibilities: that is, a case in which the unwanted diffraction light is reflected once or more by an inside wall of a lens barrel until it reaches the image plane; and a case in which it passes through the effective diameter of the optical system without such reflection. According to the investigations made by the inventors, it has been found that: of these two types of unwanted diffraction lights, the unwanted diffraction light which is reflected by the lens barrel can be reduced in its intensity to a level that can be disregarded, by means of a barrel design or an anti-reflection treatment to the inside wall of the barrel; whereas the unwanted diffraction light that directly passes through the effective diameter of the optical system may cause non-uniform exposure.

When the effect of unwanted diffraction light upon the image quality is to be evaluated, both (i) the intensity of unwanted diffraction light relative to the diffraction light of design order or orders (the intensity of regular diffraction light to be used for the imaging), upon the image plane, as well as (ii) the intensity distribution of the unwanted diffraction light upon the image plane, should be considered. Of course, it is desirable that the intensity of unwanted diffraction light upon the image plane is nearly equal to zero. However, to accomplish it is very difficult. Through the investigations made by the inventors, it has been found that, even if there is unwanted diffraction light having an intensity of a few percent of the intensity of diffraction light of design orders, there occurs substantially no adverse effect to the image quality provided that the intensity distribution of the unwanted light on the image plane is approximately uniform.

It is accordingly an object of the present invention to provide a unique and improved projection exposure apparatus and a device manufacturing method using the same.

In accordance with a first aspect of the present invention, there is provided a projection exposure apparatus, comprising: an illumination optical system for illuminating a mask with light from a light source; and a projection optical system having a diffractive optical element, for projecting an image of a pattern of the mask, as illuminated, onto a substrate, wherein said diffractive optical element is adapted to produce first diffraction light of a first order to be used for formation of the image and second diffraction light of a second order different from the first order, to be projected on the substrate to provide there a substantially uniform intensity distribution.

In accordance with a second aspect of the present invention, there is provided a projection exposure apparatus, comprising: an illumination optical system for illuminating a mask with light from a light source; and a projection optical system having a diffractive optical element, for projecting an image of a pattern of the mask, as illuminated, onto a substrate, wherein said diffractive optical element is adapted to produce first diffraction light of a first order to be used for formation of the image and second diffraction light of a second order different from the first order, and wherein a portion of the second diffraction light is not to be projected on the substrate and the other portion of the second diffraction light is to be projected on the substrate to provide there a substantially uniform intensity distribution.

In accordance with a third aspect of the present invention, there is provided a projection exposure apparatus for projecting a pattern of a first object onto a second object through a projection optical system, having a feature that said projection optical system comprises first and second diffractive optical elements disposed at or adjacent to the position of an aperture stop, and an aspherical surface lens.

In one preferred form of this aspect of the present invention, when the distance from the aperture stop to the i-th diffractive optical element is $d_i$, the distance from the first object to the second object is D, and the height of maximum light height, at the aperture stop position, that determines the numerical aperture of said projection optical system and the incidence height thereof to the i-th diffractive optical element are H and $h_i$, respectively, the following relations are satisfied:

$$0.005 < d_i/D < 0.12 \quad (1)$$

$$0.8 < h_i/H < 1.2 (i=1 \text{ or } 2) \quad (2)$$

In accordance with a fourth aspect of the present invention, there is provided a projection exposure apparatus for projecting a pattern of a first object onto a second object through a projection optical system, having a feature that said projection optical system includes first and second diffractive optical elements disposed at or adjacent to the position of an aperture stop, and that, when the distance from the aperture stop to the i-th diffractive optical element is $d_i$, the distance from the first object to the second object is D, and the height of maximum light height, at the aperture stop position, that determines the numerical aperture of said projection optical system and the incidence height thereof to the i-th diffractive optical element are H and $h_i$, respectively, the following relations are satisfied:

$$0.005 < d_i/D < 0.12 \quad (1')$$

$$0.8 < h_i/H < 1.2 (i=1 \text{ or } 2) \quad (2')$$

In one preferred form of the third or fourth aspect of the present invention, said first and second diffractive optical elements are disposed on the opposite sides of the aperture stop.

In another preferred form of the third or fourth aspect of the present invention, said first and second diffractive optical elements are disposed on a side of the aperture stop facing the first object.

In a further preferred form of the third or fourth aspect of the present invention, said first and second diffractive optical elements are disposed on a side of the aperture stop facing the second object.

In a yet further preferred form of the third or fourth aspect of the present invention, said first and second diffractive optical elements are set so that unwanted diffraction light not contributable to the imaging is projected on the second object with a uniform light intensity distribution.

In a still further preferred form of the third or fourth aspect of the present invention, said first and second diffractive optical elements are effective to correct axial chromatic aberration and color coma aberration of said projection optical system.

In a yet further preferred form of the third or fourth aspect of the present invention, said first and second diffractive optical elements have a relative ratio, not greater than 2.5, of frequencies $fR_1$ and $fR_2$ of their diffraction gratings at the largest effective diameter.

In accordance with a fifth aspect of the present invention, there is provided a projection exposure apparatus for projecting a pattern of a first object onto a second object through a projection optical system, having a feature of first and second diffractive optical elements disposed on the opposite sides of an aperture stop, respectively.

In one preferred form of this aspect of the present invention, said first and second diffractive optical elements are set so that unwanted diffraction light not contributable to the imaging is projected on the second object with a uniform light intensity distribution.

In another preferred form of this aspect of the present invention, said first and second diffractive optical elements are effective to correct axial chromatic aberration and color coma aberration of said projection optical system.

In a further preferred form of this aspect of the present invention, said first and second diffractive optical elements have a relative ratio, not greater than 2.5, of frequencies $fR_1$ and $fR_2$ of their diffraction gratings at the largest effective diameter.

In accordance with a further aspect of the present invention, there is provided a device manufacturing method comprising the steps of: projecting a pattern of a reticle onto a wafer by use of a projection exposure apparatus according to any one of the first to fifth aspects of the present invention as described above; and performing, after the pattern projection, a development process to the wafer.

In accordance with a yet further aspect of the present invention, there is provided an optical designing method for an optical system having a diffractive optical element and other optical elements such as lenses, comprising: a first step for determining the position of the diffractive optical element with respect to an optical path so that, within a predetermined range on an imaging plane defined by the optical system, predetermined diffraction light of a predetermined order from the diffractive optical element and being contributable to the imaging and unwanted diffraction light not contributable to the imaging have a substantially constant ratio; and a second step for determining optical constants (such as curvature radius, for example) of the diffractive optical element and lenses in accordance with the determination at the first step.

In accordance with a yet further aspect of the present invention, there is provided a method of producing an imaging optical system, for use in a lithographic process, having a diffractive optical element, a refractive optical element and/or a reflective optical element, having a feature that: in optical designing, the position of the diffractive optical element is determined so that, as compared with a different position, an undesirable effect, to an image plane, of diffraction light (unwanted diffraction light) from the diffractive optical element of an order other than a design order is reduced, and then optical constants such as curvature radius, for example, of the diffractive optical element, the refractive optical element and/or the reflective optical element are determined.

In one preferred form of this aspect of the present invention, the undesirable effect includes non-uniformness of light quantity.

In another preferred form of this aspect of the present invention, the position of the diffractive optical element, reducing the undesirable effect, is set at or adjacent to an aperture stop.

In a further preferred form of this aspect of the present invention, the imaging optical system includes two or more diffractive optical elements.

In a still further preferred form of this aspect of the present invention, at least one of the refractive optical element and the reflective optical element has an aspherical surface.

In a yet further aspect of the present invention, there is provided an imaging optical system which is produced in accordance with the imaging optical system producing method as recited above.

In a yet further aspect of the present invention, there is provided a device manufacturing method including a process for imaging and transferring a device pattern onto a substrate by use of an imaging optical system as recited above.

In a yet further aspect of the present invention, there is provided a projection exposure apparatus, comprising: a projection optical system including an imaging optical system as recited above; and an illumination optical system for illuminating a mask having a pattern to be projected by said projection optical system.

These and other objects, features and advantages of the present invention will become more apparent upon a consideration of the following description of the preferred embodiments of the present invention taken in conjunction with the accompanying drawings.

BRIEF DESCRIPTION THE DRAWINGS

DESCRIPTION OF THE PREFERRED EMBODIMENTS

Figure 1:
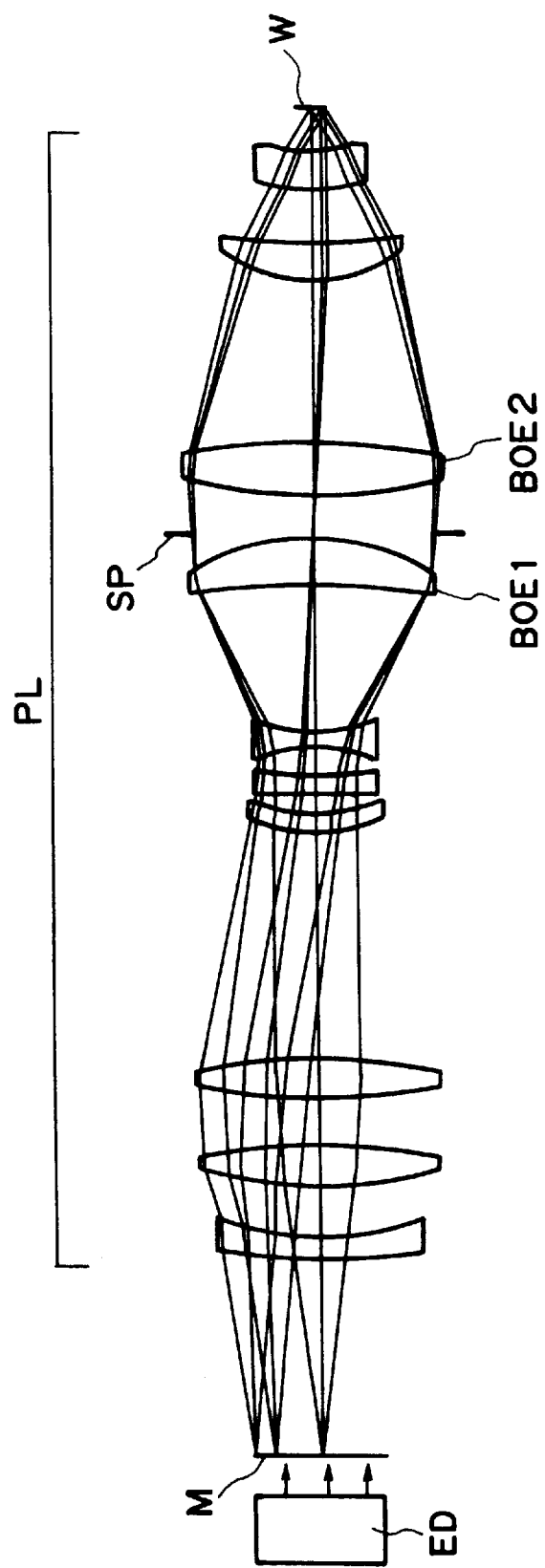
FIG. 1 is a schematic view of a main portion of a projection optical system according to a first embodiment of the present invention.

FIG. 1 is a schematic view of a main portion of a projection exposure apparatus according to a first embodiment of the present invention. In this embodiment, the invention is applied to a projection exposure of a step-and-repeat type or step-and-scan type for an lithographic process of a submicron or quartermicron order or less. This is also the case with other embodiments to be described later. Denoted in the drawing at PL is a projection optical system. The illustration shows a state in which a first object such as a reticle or mask M (hereinafter "mask") having an electronic circuit pattern formed thereon is illuminated with exposure light from an illumination device ED, comprising a light source and an illumination optical system, and in which the device pattern of the first object M is projected by the projection optical system PL on a shot region of a second object such as a wafer W (silicon substrate), in a reduced scale. The light source may comprise a KrF excimer laser, an ArF excimer laser or an $F_2$ laser, for example.

Denoted at SP is a stop (aperture stop) which determines the pupil plane of the projection optical system PL. Denoted at BOE1 and BOE2 are first and second diffractive optical elements formed on the surfaces of lenses, respectively. Each diffractive optical element comprises a binary optics element. These diffractive optical elements BOE1 and BOE2 are provided on the corresponding lenses so that they are placed adjacent to the pupil plane SP and that they sandwich the pupil plane therebetween.

This embodiment employs such a structure that the first and second diffractive optical elements BOE1 and BOE2 each having a predetermined diffraction grating structure are disposed adjacent to and before and after the pupil plane of the projection optical system PL. This enables superior correction of aberrations including chromatic aberration.

Additionally, an adverse effect (e.g., non-uniform exposure) on the image plane (shot region) due to the flare component resulting from unwanted diffraction light to be provided by the provision of the diffractive optical elements, can be reduced or avoided.

Figure 26:
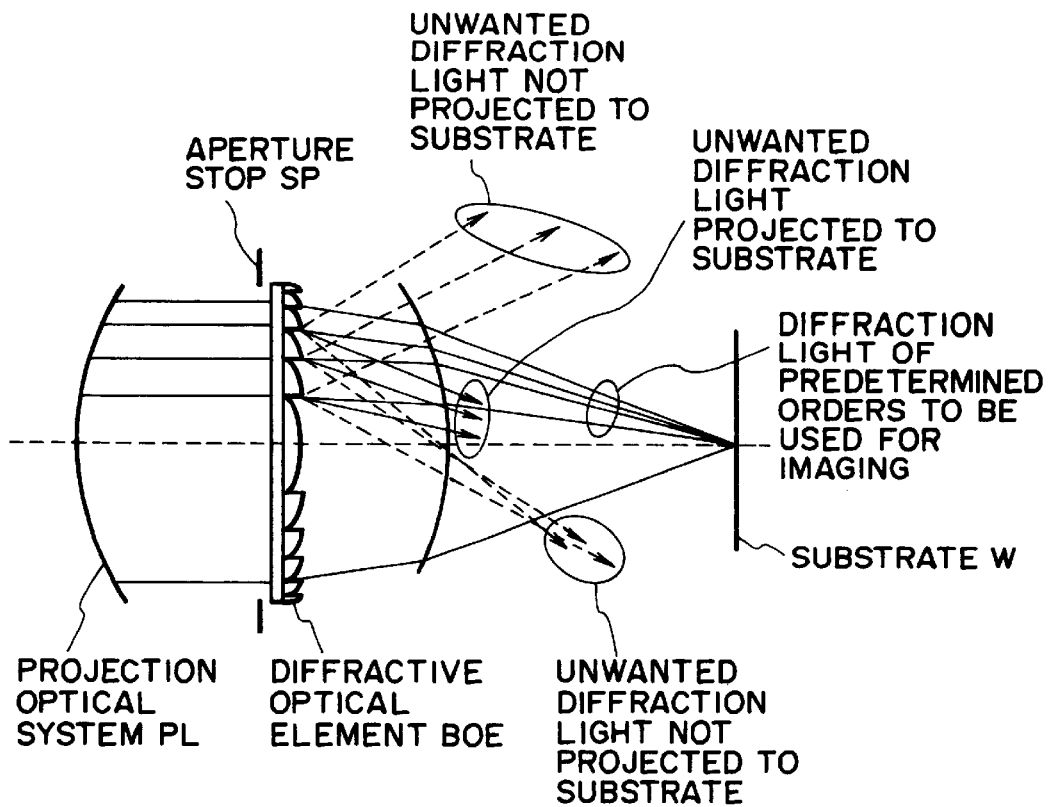
FIG. 26 is a schematic view for explaining unwanted diffraction light.

FIG. 26 illustrates unwanted diffraction light produced by one diffractive optical element BOE. The unwanted diffraction light comprises diffraction light of a diffraction order or orders different from the order or orders of predetermined diffraction light which is to be used for formation of an image of the pattern of the first object M. A portion of the unwanted diffraction light is not projected on the substrate W, but is incident on the inside wall of the lens barrel and is absorbed thereby. The remaining portion of the unwanted light impinges on the substrate W. In the present invention, in order to avoid non-uniformness of exposure, the structure is arranged to assure that the unwanted diffraction light impinging on the substrate W provides a substantially uniform light intensity distribution within the shot region on the substrate.

Each of the first and second diffractive optical elements BOE1 and BOE2 is made of a material of quartz. Also, the projection optical system PL comprises lenses of a single glass material of quartz or fluorite, or glass materials of quartz and fluorite. Specifically, in the embodiments described below, all of the diffractive optical elements and lenses may be provided by a single glass material of quartz.

In this embodiment, two diffractive optical elements which satisfy the above-described conditions, i.e., equations (1) and (2) or equations (1') and (2'), may be used. Alternatively, only one diffractive optical element which satisfies these conditions or three diffractive optical elements satisfying the conditions, may be used.

In this embodiment, the pattern (device pattern) of the first object M as illuminated with exposure light from the illumination device ED is projected by the projection optical system PL onto the second object (wafer) W. After this, the exposed wafer is processed by a development treatment, and semiconductor devices are produced.

The diffractive optical elements BOE1 and BOE2 according to this embodiment will be explained. The projection optical system PL of this embodiment uses phase type diffractive optical elements as the first and second diffractive optical elements BOE1 and BOE2. It is known that, with a phase type diffractive optical element, if it has an idealistically produced kinoform, it can provide 100% diffraction efficiency (the intensity ratio of the light as deflected and transmitted in a desired direction, to the light incident on the diffractive optical element).

In the phase type diffractive optical element used in this embodiment, the phase of light impinging on the diffractive optical element is changed by an amount corresponding to the applied phase function, by which deflection toward a desired direction is accomplished. Here, the phase function can be defined as a function of position upon the diffractive optical element.

Usually, a diffractive optical element is revolutionally symmetric. Thus, the phase function is a function of a distance r from the optical axis. For example, the phase function $\phi(r)$ of an aberration-free lens having a focal length f is given by:

$$\phi(r) = -(2\pi/\lambda)(\sqrt{r^2+f^2}-f)$$

where $\lambda$ is the wavelength of light used.

While the phase function $\phi(r)$ represents the phase, in order to realize this phase change with the diffractive optical element, it is represented by an optical path length (optical path length function) opl(r). The optical path length opl(r) necessitates dividing the phase function $\phi(r)$ by $2\pi$. Here, the unit of length is the wavelength $\lambda$.

$$opl(r) = -(\sqrt{r^2+f^2}-f)/\lambda$$

Regarding the shape of a diffractive optical element that provides this optical path length opl(r), if it is in air and the refractivity of the glass material with the wavelength $\lambda$ is n, the shape F(r) is given by:

$$F(r) = -(\sqrt{r^2+f^2}-f)/[\lambda(n-1)]$$

Basically, the shape F(r) above represents the surface shape of a refractive optical element. A diffractive optical element uses a phenomenon that the phase term of light corresponds to a period $2\pi$. First, such $r=R_m$ (m is an integer: $R_0=0$, and it is counted sequentially from the optical axis toward the outside) of a value which corresponds, in terms of phase function $\phi(r)$, to a product of $2\pi$ by an integer is calculated, and then a phase function wherein a product of $2\pi$ by an integer is added so that the value in the period $[R_m, R_{m+1}]$ comes into the range $[0, 2\pi]$, is prepared. This corresponds to that, with the optical path length function opl(r), it goes into the range $[0, 1]$ in the period $[R_m, R_{m+1}]$.

Thus, an aberration-free lens based on a diffractive optical element can be provided by applying the surface shape to the diffractive optical element on the basis of a function as dividing by (n−1) the optical path length function opl(r) where the value range is $[0, 1]$. Usually, a diffractive optical element whose diffraction effect is provided by the surface shape of the element (i.e., surface protrusions and grooves) is called "surface relief type".

In a phase type diffractive optical element, a desired aspherical surface effect can be provided by the manner of applying the phase function $\phi(r)$. Also, since the value range of the optical path length function opl(r) is $[0, 1]$, the depth of a necessary surface shape F(r) is on an order of the wavelength. Thus, the diffractive optical element can be made thin. Additionally, since deflection of light through diffraction by a diffractive optical element becomes larger with a longer wavelength, it provides an opposite color dispersion characteristic to a refractive optical element of an ordinary glass material. Thus, when a refractive optical element and a diffractive optical element are used in combination, correction of chromatic aberration can be done without the use of different glass materials. The diffractive optical elements BOE1 and BOE2 of the first embodiment of FIG. 1 may be based on these features, as desired.

In this embodiment, the features as described above are applied to a projection optical system of a semiconductor device manufacturing projection exposure apparatus of a step-and-repeat or step-and-scan type.

Currently, the wavelength of exposure light usable with a projection optical system of a stepper is mainly light of i-line ($\lambda=365$ nm). Additionally, there are cases where light of the ultraviolet region such as, for example, a KrF excimer laser ($\lambda=248$ nm) or a next generation an ArF excimer laser ($\lambda=193$ nm) is used as exposure light. The glass material which has sufficient transmissivity to light of such an ultraviolet region is limited to $SiO_2$ and $CaF_2$ only. Particularly, the glass material for a projection optical system usable with light of a $F_2$ laser is $CaF_2$ only.

Since the type of glass material usable for a refractive optical element is limited as described, when a projection optical system to be used with exposure light of the ultraviolet region is provided only by refractive optical elements, correction of chromatic aberration is difficult to accomplish. Also, for correction of chromatic aberration, a strict condition is applied with respect to the bandwidth of the light source. Further, the number of lenses becomes larger because of required aberration correction, assuring the optical performance. This results in an increase of total thickness of the lenses and thus in degraded transmissivity of the whole optical system. The decrease of transmissivity, that is, the increase of absorption by lenses, is undesirable from the viewpoint of exposure aberration.

In this embodiment, the problems of chromatic aberration and increased total thickness of lenses in a projection optical system to be used with exposure light of the ultraviolet region, can be solved by providing a diffractive optical element of appropriate shape at the position of or adjacent to the pupil position of the projection optical system. Thus, in this embodiment, non-uniform exposure is substantially avoided.

A diffractive optical element usable in this embodiment may be produced, not by directly forming an idealistic shape (blazed shape or kinoform shape) on a transparent substrate, but by approximating such an idealistic shape with a stepped shape (with levels). Although directly forming a blazed shape or kinoform shape is difficult in the point of required machining precision, for example, in this embodiment a stepper may be used for production of a diffractive optical element to be used. This facilitates the manufacture of a diffractive optical element of a fine structure.

Since a diffractive optical element used in this embodiment has a shape approximating the idealistic shape with a level structure, the diffraction efficiency does not reach 100% and there is a small amount of unwanted diffraction light produced.

If the number of steps (levels) is N and the diffraction order (design order) of diffraction light being diffracted in a desired deflection direction is 1, the diffraction efficiency $\eta^N_m$ of diffraction light of a diffraction order m other than 1 is expressed as follows:

$$\eta^N_m = [\{\sin(\pi m/N)\sin(\pi(1-m))\}/\{\pi m \sin(\pi(1-m)/N)\}]^2$$

The above is based on an assumption that the depth of relief of the diffractive optical element has been optimized. Here, if 1 is substituted into m of the above equation, then $\eta^\infty_1 = 1$ results. From this, it is seen that in an idealistic case where the depth is optimized, the diffraction efficiency is 100%. Practically, from the precision of machining and diffraction efficiency, N may be set to about 8 to 16. Preferably, from the standpoint of manufacture, N may be set to about 8. On that occasion, the diffraction efficiency is $\eta^8_1 = 0.95$. Further, $\eta^8_m$ has a value only with m= . . . , −15, −7, 1, 9, 17, . . . , and thus the following is given:

$$\eta^8_m = [\sin(\pi m/8)/(\pi m/8)]^2$$

Examples are $\eta^8_9 = 0.117$ and $\eta^8_{17} = 0.0033$. Namely, with a diffractive optical element of eight steps (levels), unwanted diffraction light appears in the order represented by m=8n+1 (n is an integer other than 0). Similarly, if the precision of approximation is enhanced and the element has steps of a number sixteen (N=16), unwanted diffraction light will appear in the order represented by m=16n+1 (n is an integer other than 0).

As described, when a diffractive optical element is used, there is unwanted diffraction light produced. The unwanted diffraction light does not satisfy the imaging condition, and thus when it is incident on the image plane, it produces a flare component. This causes non-uniformness of exposure and degradation of image quality. It is, therefore desirable to prevent, as much as possible, impingement of (unwanted) diffraction light of order m= . . . , −15, −7, 9, 17, . . . (in the case of a diffractive optical element with eight steps) or (unwanted) diffraction light of order m= . . . , −31, −15, 17, 33, . . . (in the case of a diffractive optical element with sixteen steps), onto a predetermined area on the image plane (shot area on the wafer).

In conventional projection optical systems having a diffractive optical element, focus is put on correction of aberration only. There is no attention given to the effect of unwanted diffraction light.

Figure 27:
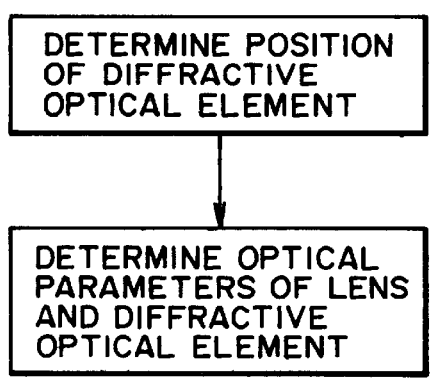
FIG. 27 is a flow chart for explaining the procedure of an optical designing method and optical system producing method, according to the present invention.

In an optical designing method according to the present invention, when it is applied to designing an optical system having a diffractive optical element and lenses, the procedure includes as shown in FIG. 27 (i) a first step for determining the position of the diffractive optical element with respect to an optical path so that, within a predetermined range on an imaging plane defined by the optical system, predetermined diffraction light of a predetermined order from the diffractive optical element and being contributable to the imaging and unwanted diffraction light not contributable to the imaging have a substantially constant ratio, and (ii) a second step for determining optical constants such as curvature and thickness, for example, of the diffractive optical element and lenses in accordance with the determination at the first step.

The present embodiment and other embodiments to be described may be based on this optical designing method.

Also, in a method of producing an imaging optical system, for use in a lithographic process, having a diffractive optical element, a refractive optical element and/or a reflective optical element, according to the present invention, as shown in FIG. 27, in optical designing, the position of the diffractive optical element is determined so that, as compared with a different position, an undesirable effect, to an image plane, of diffraction light from the diffractive optical element of an order other than a design order is reduced, and then optical constants such as curvature and thickness, for example, of the diffractive optical element, the refractive optical element and/or the reflective optical element are determined.

The refractive optical element and/or the reflective optical element may have an aspherical surface, and the undesirable effect may be non-uniformness of exposure. The position with a less undesirable effect may be the position at or adjacent to the aperture stop, and the diffractive optical element may be disposed there.

In this embodiment, at least two diffractive optical elements may be disposed adjacent to the aperture stop within the projection optical system, by which superior aberration correction is assured and an undesirable effect of unwanted diffraction light is prevented.

The two diffractive optical elements may be disposed so as to satisfy the two conditions of equations (1) and (2) described above. This reduces non-uniformness of exposure, and assures good optical performance.

The condition of equation (1) is to geometrically restrict the distance d between the pupil (aperture stop) and the first or second diffractive optical element. The condition of equation (2) is to restrict extension of a largest light ray, determining the numerical aperture (NA), from the object point, with respect to the surface of the first or second diffractive optical element.

If one of the upper and lower limits of the conditions of equations (1) and (2) is exceeded, it becomes difficult to reduce non-uniformness of exposure on the image plane (shot area on the substrate).

In the present invention, at least two diffractive optical elements are provided within the projection optical system, and they are disposed adjacent to the pupil plane (i.e., aperture stop SP) of the projection optical system. With this arrangement, unwanted diffraction light is added, upon the image plane, to the regular image (mask pattern image) as background light having a substantially uniform light intensity distribution. While the contrast of the image may reduce slightly, substantially uniform contrast is provided over the whole image plane and, therefore, it can be met by a process to be done later.

In this embodiment, an optical path length function opl(r) is used to describe the characteristic of a diffractive optical element (binary optics element).

If the distance from the optical axis of the diffractive optical element is denoted by r, $$opl(r)=(C_1 r^2+C_2 r^4+C_3 r^6)/\lambda_p$$

is used and, based on this, the coefficients $C_1$, $C_2$ and $C_3$ as well as the wavelength $\lambda$ are given. Here, the wavelengths $\lambda_p$ is one called production wavelength. In designing, it may be the same as or different from the wavelength to be actually used in the optical system. In this embodiment, the exposure light used may have a bandwidth not greater than several hundred picometers (300 pm).

As regards the aspherical surface shape, it is determined on the basis of:

$$z(r)=[cr^2/\{1+\sqrt{1-(1+K)c^2 r^2}\}]+Ar^4+Br^6+Cr^8+Dr^{10}+Er^{12}+Fr^{14}$$

and by giving K, c, A, B, C, D, E and F, wherein c is the curvature radius.

A numerical example of the projection optical system according to the first embodiment of the present invention will be described below.

NUMERICAL EXAMPLE 1

| Object Height: 0 mm, 35 mm, 50 mm   NA = 0.50   λ = 193.00 nm | | | |
|---|---|---|---|
| Surface Number | Curvature Radius | Surface Spacing | Refractivity (λ = 193.00 nm) |
| OBJ: | INFINITY | 148.52 | 1.0 |
| 1: | 630.31 | 15.00 | 1.560772 |
| 2: | 220.99 | 36.235 | 1.0 |
| (aspherical) K: −2.28 | | | |
| A: 0.226E−07 | B: 0.715E−12 | C: −0.299E−16 | |
| D: 0.634E−20 | E: −0.168E−23 | F: 0 | |
| 3: | 290.81 | 30.00 | 1.560772 |
| (aspherical) K: −0.0262 | | | |
| A: −0.214E−08 | B: 0.369E−12 | C: −0.933E−17 | |
| D: −0.141E−20 | E: −0.907E−25 | F: 0 | |
| 4: | −572.22 | 36.339 | 1.0 |
| 5: | 466.213 | 30.00 | 1.560772 |
| 6: | −407.87 | 164.326 | 1.0 |
| 7: | 123.981 | 13.00 | 1.560772 |
| 8: | 110.516 | 15.00 | |
| (aspherical) K: 0.000000 | | | |
| A: 0.167E−07 | B: 0.208E−10 | C: 0.783E−14 | |
| D: −0.386E−18 | E: 0.347E−22 | F: 0 | |
| 9: | 1546.52 | 13.00 | 1.560772 |
| 10: | 174.68 | 21.00 | 1.0 |
| (aspherical) K: −0.972 | | | |
| A: −0.233E−07 | B: −0.612E−10 | C: −0.145E−13 | |
| D: −0.362E−17 | E: 0.265E−20 | F: 0 | |
| 11: | −140.57862 | 13.000000 | 1.560772 |

-continued

| Object Height: 0 mm, 35 mm, 50 mm   NA = 0.50   λ = 193.00 nm | | | |
|---|---|---|---|
| Surface Number | Curvature Radius | Surface Spacing | Refractivity (λ = 193.00 nm) |
| (aspherical) K: 4.804 | | | |
| A: −0.153E−06 | B: −0.903E−11 | C: 0.852E−14 | |
| D: −0.744E−17 | E: 0.512E−20 | F: 0 | |
| 12: | 125.62 | 108.47 | 1.0 |
| 13: | −660.11 | 35.00 | 1.560772 |
| (BOE) Design Order −1 λp = 632.80 nm | | | |
| C1: 3.24E−03 | C2: −4.34E−09 | C3: 2.08E−13 | |
| 14: | −172.686 | 1.00 | 1.0 |
| (aspherical) K: 0.0130 | | | |
| A: −0.693E−09 | B: 0.377E−13 | C: 0.192E−17 | |
| D: −0.615E−22 | E: −0.247E−25 | F: 0.955304E−30 | |
| 15: STOP | INFINITY | 32.000000 | |
| (Stop) | | | |
| 16: | 424.39 | 37.00 | 1.560772 |
| (aspherical) K: 0.437 | | | |
| A: 0.675E−09 | B: 0.905E−15 | C: −0.521E−18 | |
| D: −0.758E−22 | E: −0.386E−26 | F: −0.153E−30 | |
| 17: | −729.28 | 119.71 | 1.0 |
| (BOE) Design Order −1 λp = 632.80 nm | | | |
| C1: 1.714E−03 | C2: −1.654E−09 | C3: −2.586E−13 | |
| 18: | 109.24 | 30.00 | 1.560772 |
| (aspherical) K: −0.212307 | | | |
| A: 0.762E−09 | B: −0.470E−12 | C: −0.145600E−15 | |
| D: −0.346E−20 | E: −0.158E−23 | F: 0 | |
| 19: | 462.671 | 39.20 | 1.0 |
| 20: | 139.22 | 30.00 | 1.560772 |
| 21: | 128.21 | 32.28 | 1.0 |
| (aspherical) K: 1.26 | | | |
| A: 0.180E−06 | B: 0.746E−12 | C: −0.270E−13 | |
| D: −0.115E−16 | E: 0.481E−20 | F: 0 | |
| IMG: IMAGE PLANE | INFINITY | 0.001225 | |

Figure 2:
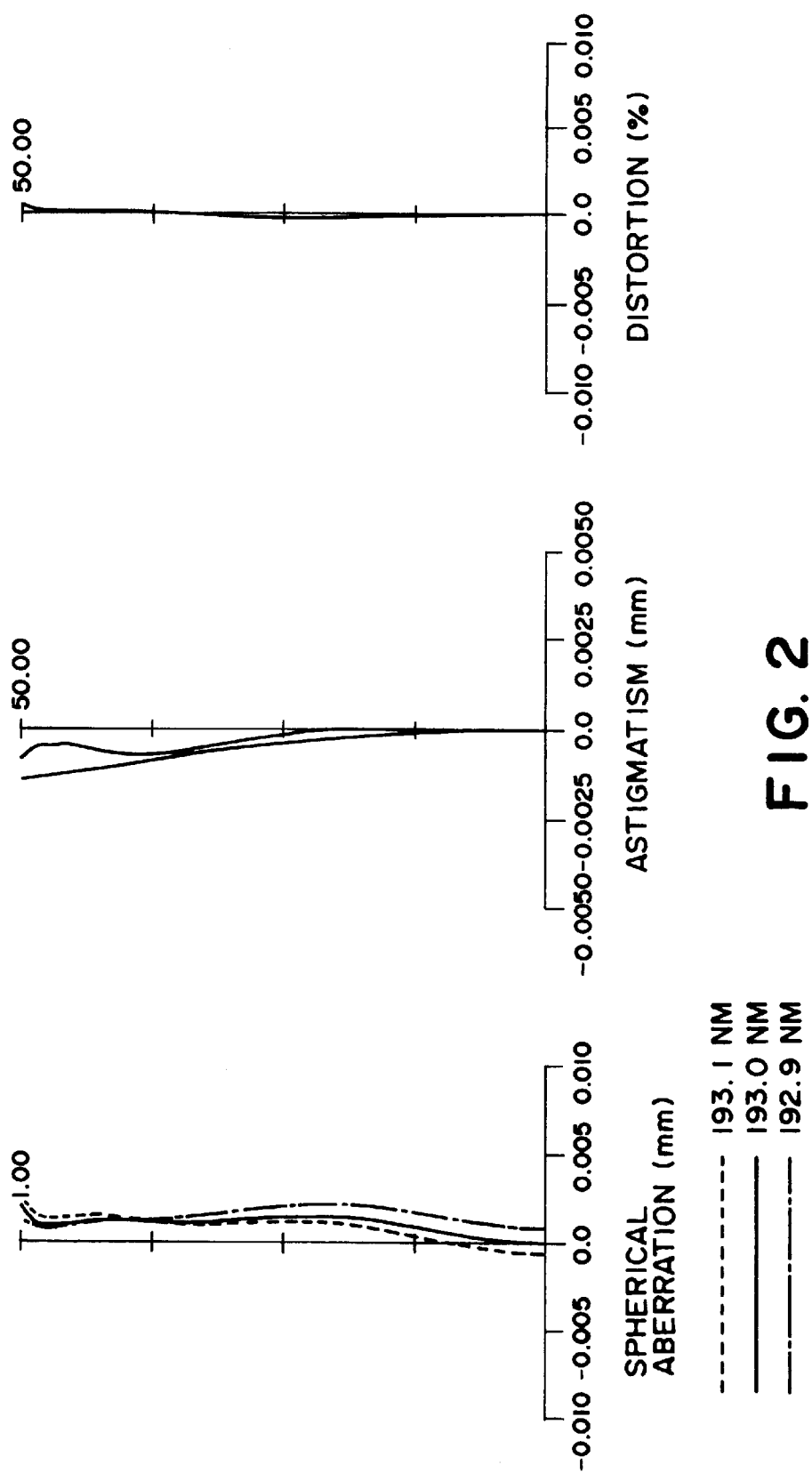
FIG. 2 shows spherical aberration, astigmatism and distortion of the projection optical system of the first embodiment of the present invention.
Figure 3:
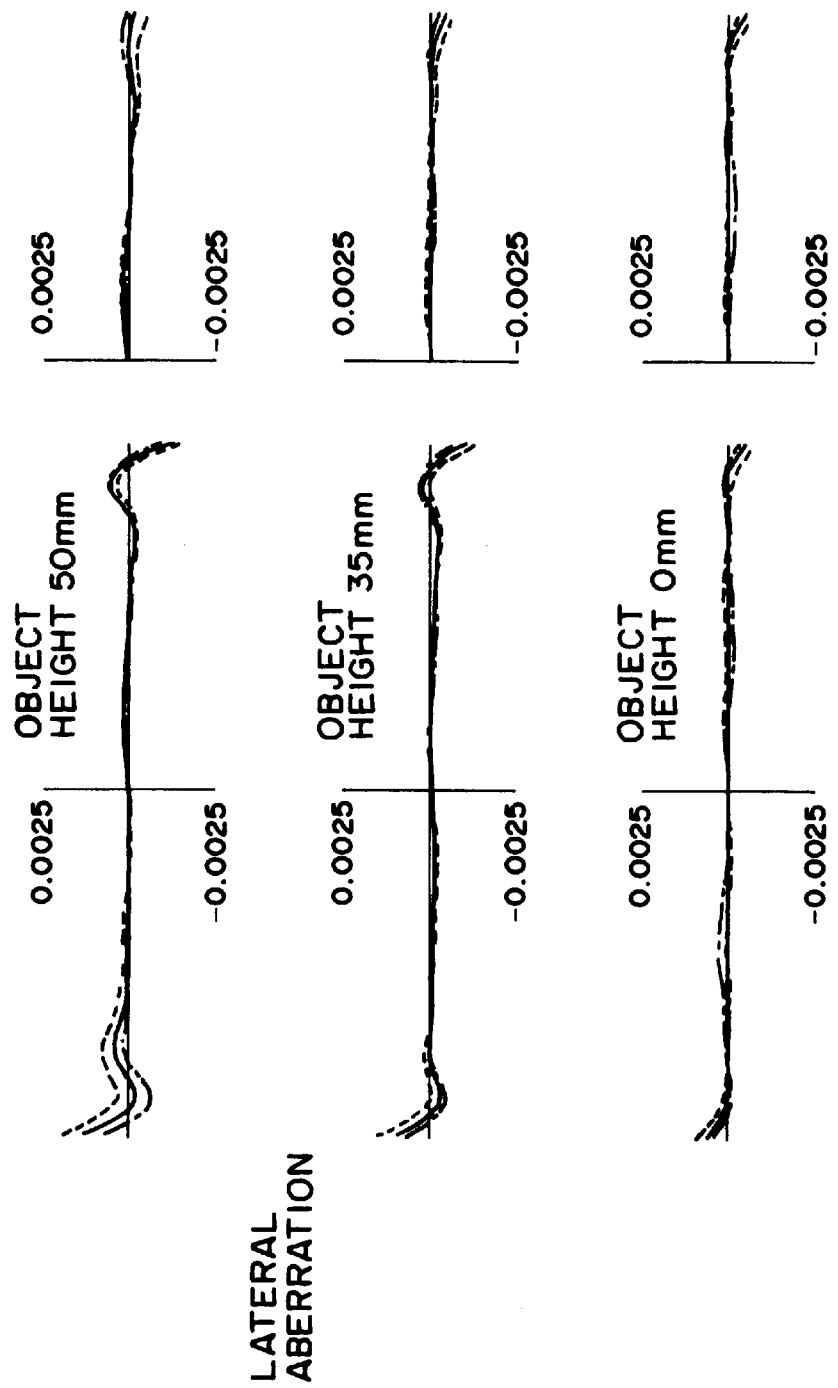
FIG. 3 shows lateral aberration of the projection optical system of the first embodiment of the present invention.

FIGS. 2 and 3 illustrate aberrations of Numerical Example 1.

Irrespective of that the optical system is provided by a single glass material, all of these aberrations including chromatic aberration are corrected satisfactorily, and the effect of the diffractive optical elements well appears.

Figure 4:
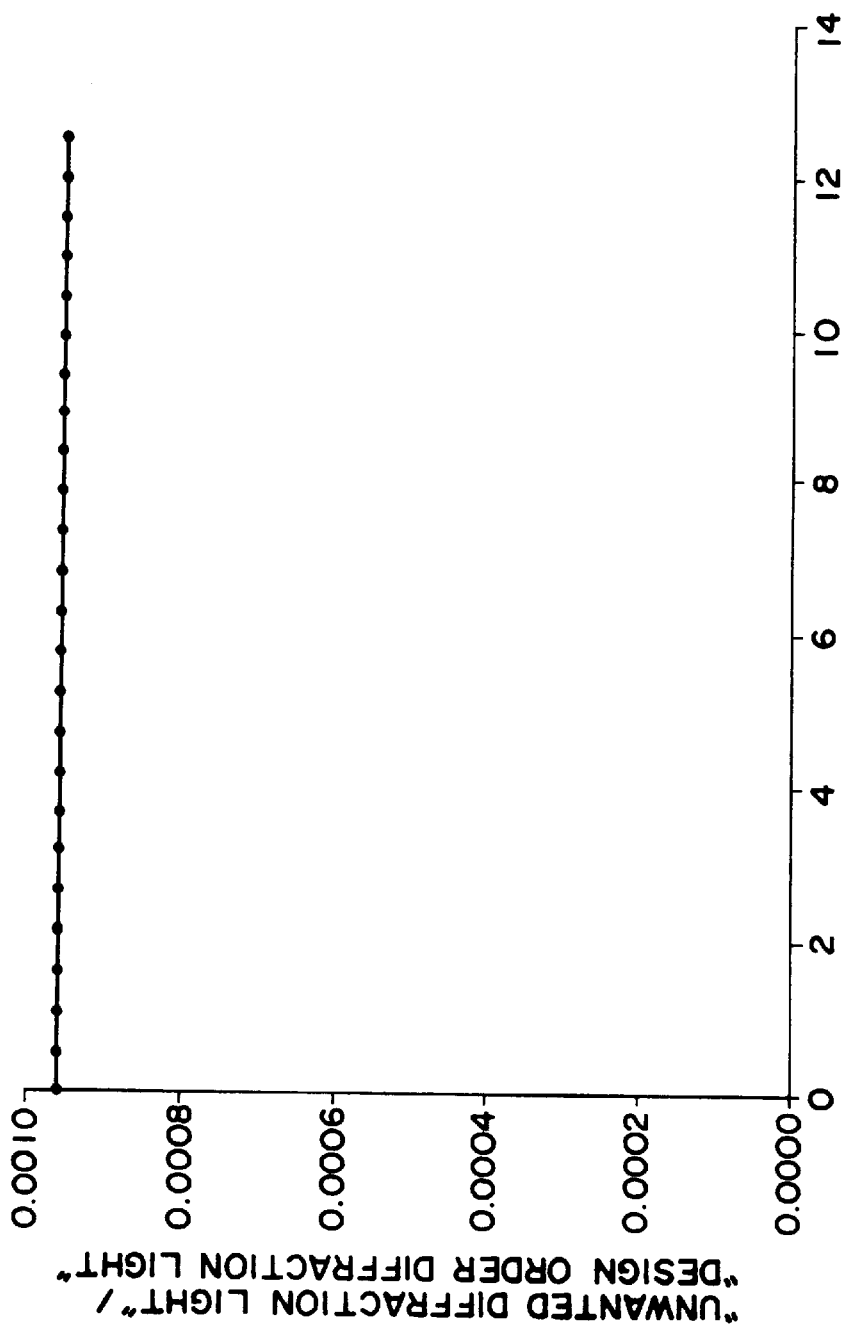
FIG. 4 shows an intensity distribution of unwanted diffraction light as defined on an image plane by the projection optical system of the first embodiment of the present invention.

FIG. 4 shows an intensity distribution of unwanted diffraction light upon the image plane, in this embodiment, wherein the intensity of unwanted light is illustrated as being standardized with respect to the intensity of diffraction light of a design order.

Calculation of unwanted diffraction light here is based on that there is a circular opening of a radius 50 mm on the object plane and the luminance distribution and light orientation distribution are uniform over the whole circular opening, and that each of two diffractive optical elements has a step structure of eight levels. It is seen from FIG. 4 that in this embodiment the intensity ratio of the unwanted diffraction light to the diffraction light of a design order is about 0.1% and it is substantially uniform over the whole image plane, and that the effect of the unwanted diffraction light is very small.

Figure 21:
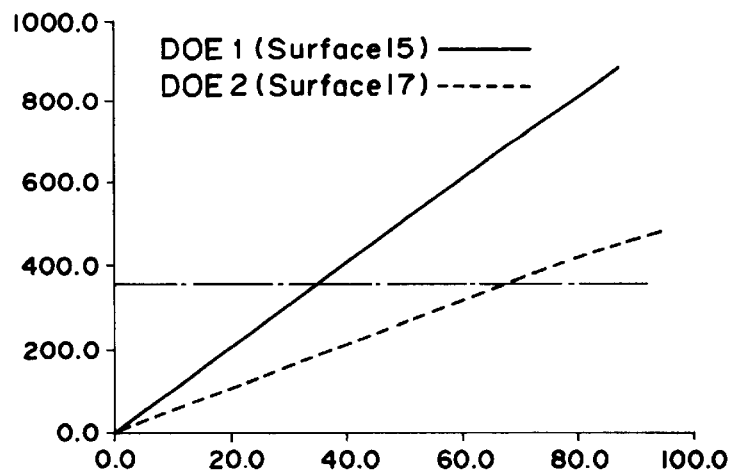
FIG. 21 is a graph for explaining the relation between effective radius and frequency of a diffractive optical element in the first embodiment of the present invention.

FIG. 21 shows the relation between the effective radius of the diffractive optical element and the frequency, in this embodiment.

Figure 5:
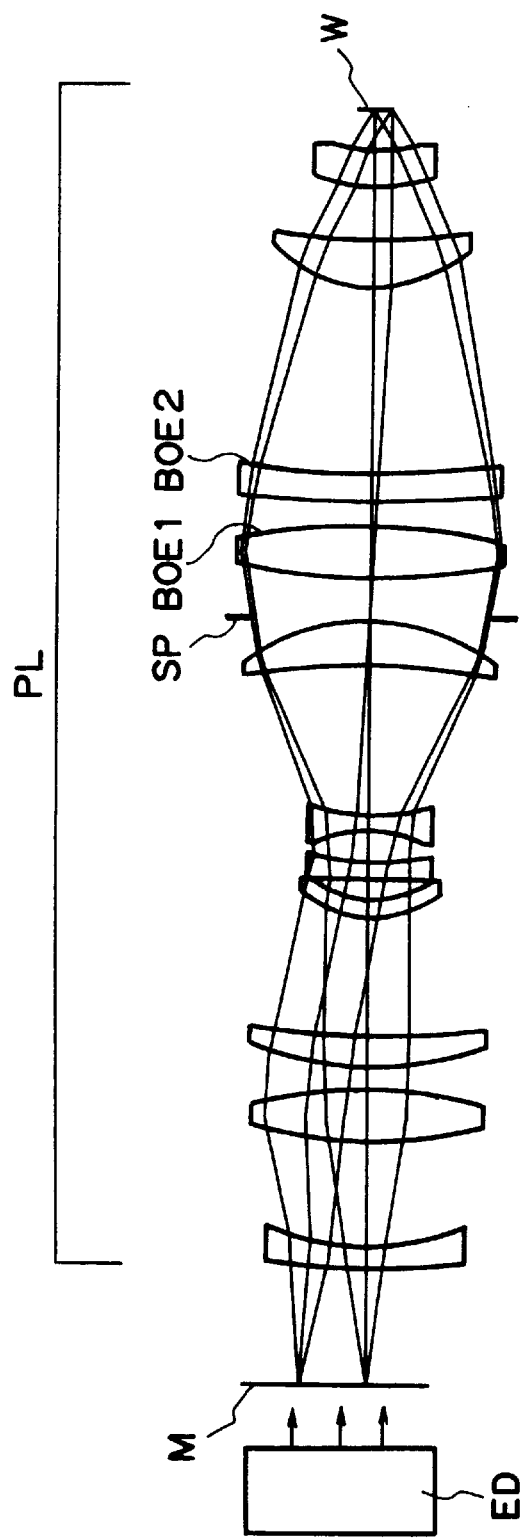
FIG. 5 is a schematic view of a main portion of a projection optical system according to a second embodiment of the present invention.

FIG. 5 is a schematic view of a main portion of an optical system according to a second embodiment of the present invention. This embodiment differs from the first embodiment of FIG. 1 in the point that diffractive optical elements BOE1 and BOE2 are provided on the surfaces of two lenses which are disposed on one side of the aperture stop SP, facing the image plane. The remaining portion has essentially the same structure.

Figure 6:
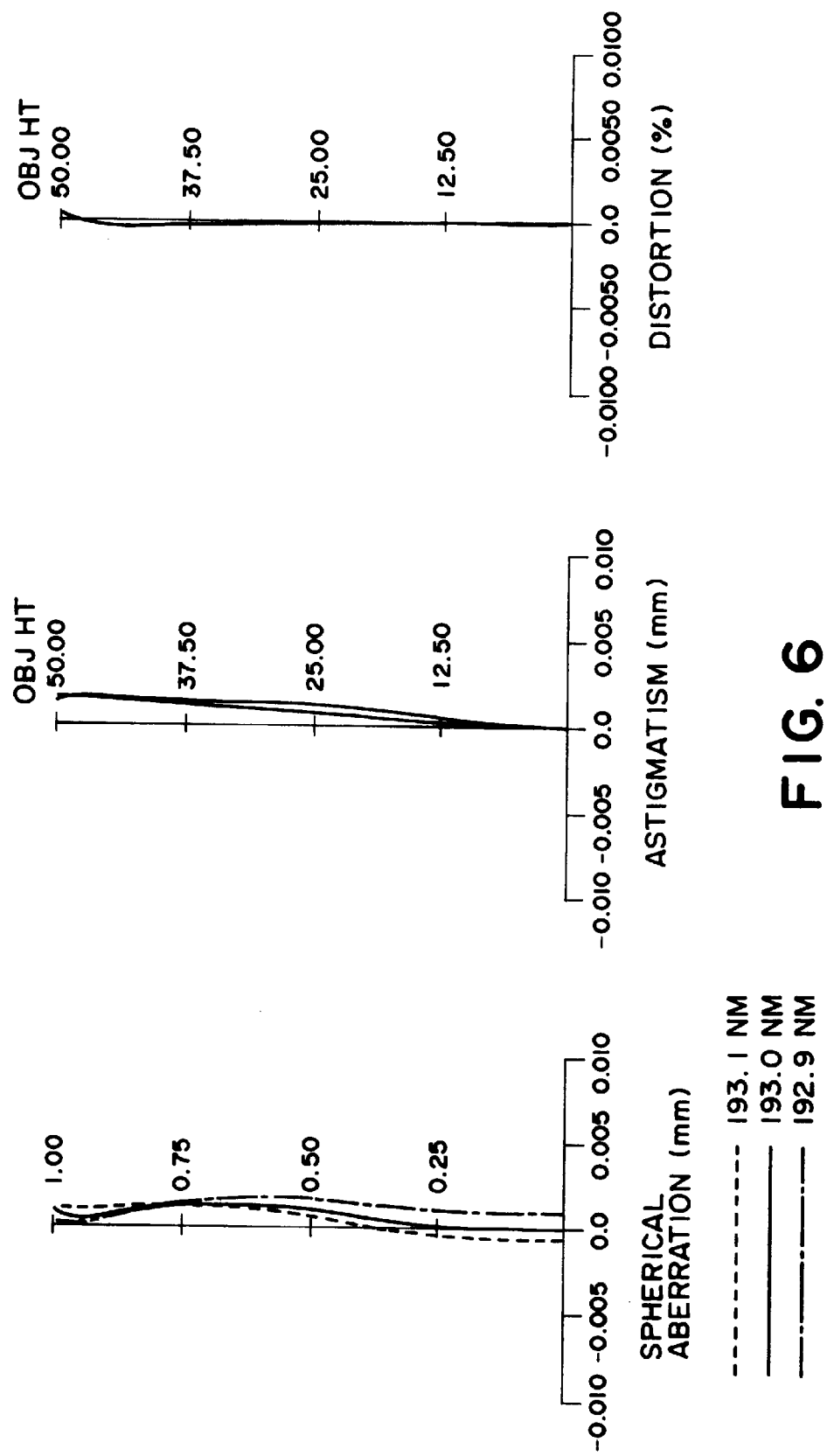
FIG. 6 shows spherical aberration, astigmatism and distortion of the projection optical system of the second embodiment of the present invention.
Figure 7:
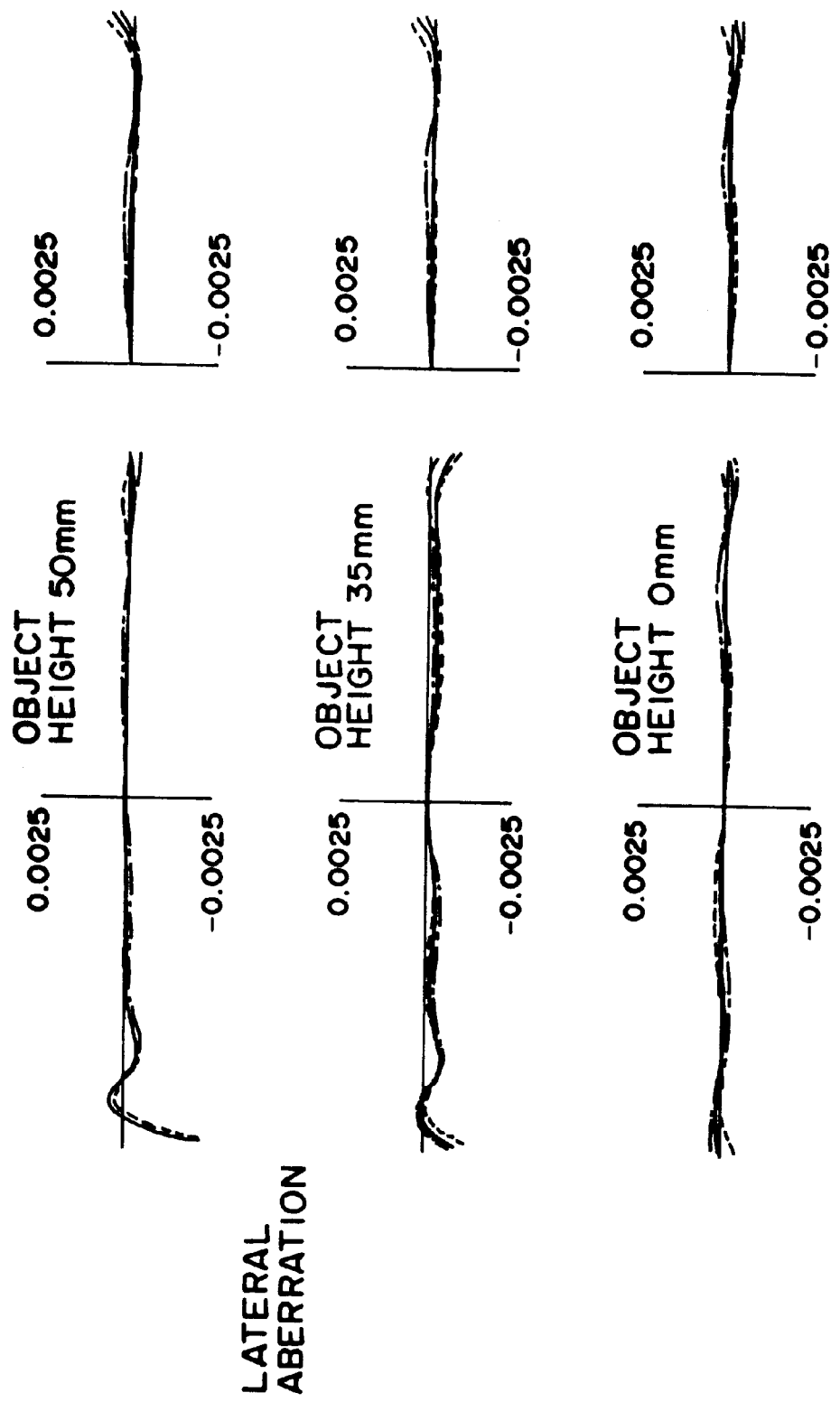
FIG. 7 shows lateral aberration of the projection optical system of the second embodiment of the present invention.

Both of the diffractive optical elements used in this embodiment are disposed in the neighborhood of the pupil and on the image plane side thereof. FIGS. 6 and 7 show aberrations of a numerical example (Numerical Example 2) according to this embodiment, to be described below. Although the optical system is provided by a single glass material, aberrations including chromatic aberration are well corrected.

Figure 8:
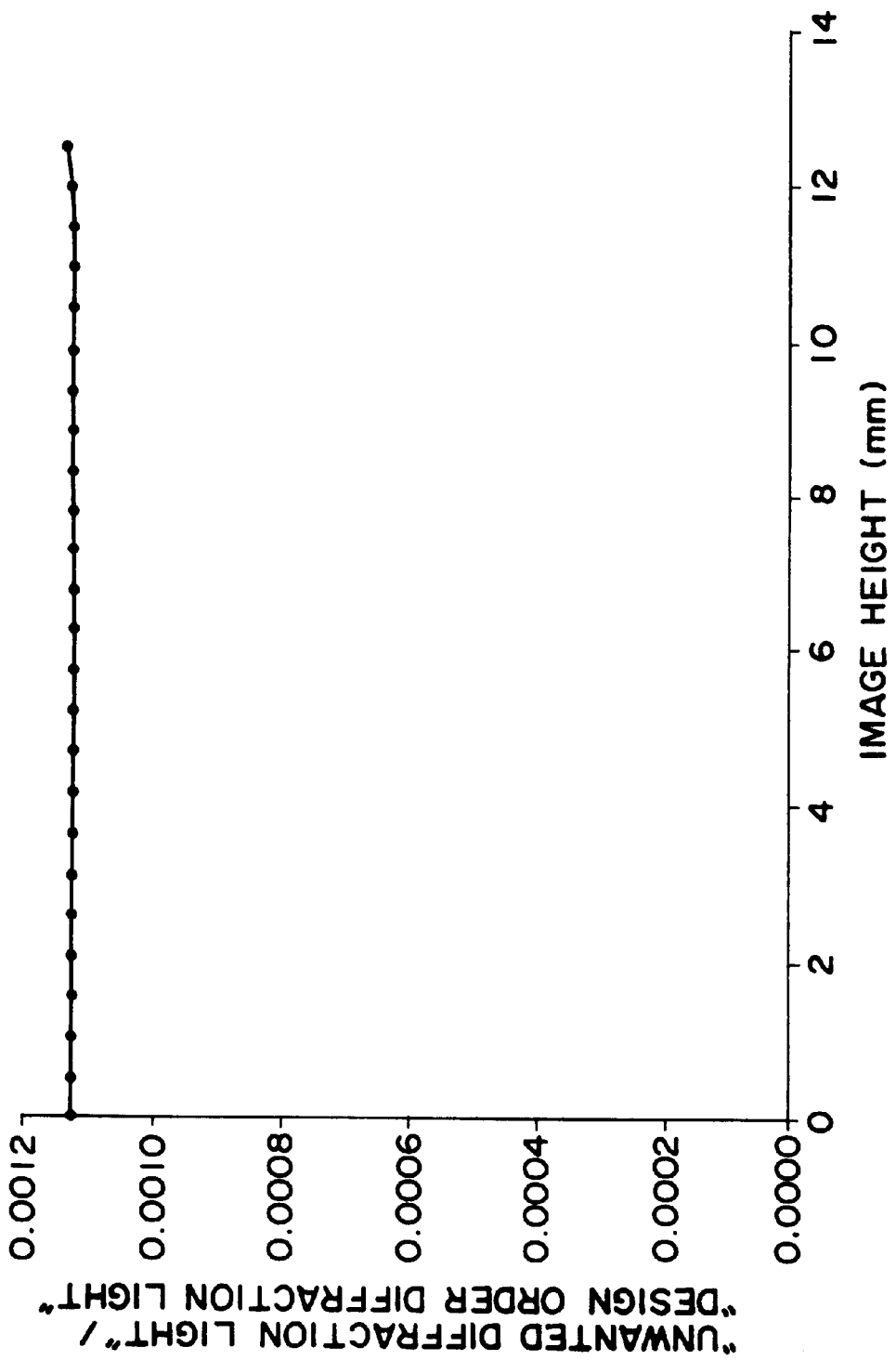
FIG. 8 shows an intensity distribution of unwanted diffraction light as defined on an image plane by the projection optical system of the second embodiment of the present invention.

FIG. 8 shows an intensity distribution of unwanted diffraction light upon the image plane, in this embodiment, wherein the intensity of unwanted light is illustrated as being standardized with respect to the intensity of diffraction light of a design order. Calculation of unwanted diffraction light here is based on that there is a circular opening of a radius 50 mm on the object plane and the luminance distribution and light orientation distribution are uniform over the whole circular opening, and that each of two diffractive optical elements has a step structure of eight levels.

It is seen from FIG. 8 that in this embodiment the intensity ratio of the unwanted diffraction light to the diffraction light of design order is about 0.11% and it is substantially uniform over the whole image plane, and that the effect of the unwanted diffraction light is very small.

Figure 22:
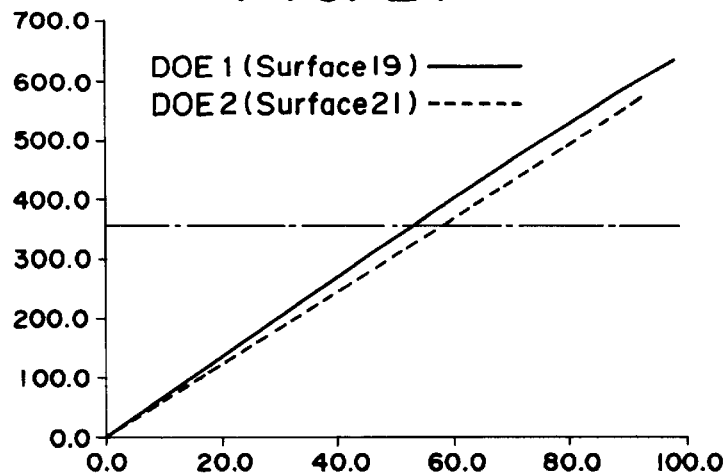
FIG. 22 is a graph for explaining the relation between effective radius and frequency of a diffractive optical element in the second embodiment of the present invention.

FIG. 22 shows the relation between the effective radius of the diffractive optical element and the frequency, in this embodiment.

Next, a numerical example (Numerical Example 2) according to this embodiment will be described.

NUMERICAL EXAMPLE 2

| Spec.: Magnification = 1/4, | NA = 0.50 | λ = 193.00 nm | |
|---|---|---|---|
| Surface Number | Curvature Radius | Surface Spacing | Refractivity (λ = 193.00 nm) |
| OBJ: | INFINITY | 110.522 | 1.0 |
| 1: | 709.86 | 15.00 | 1.560772 |
| 2: | 165.02 | 80.486 | 1.0 |
| (aspherical) K: −2.83 | | | |
| A: 0.186E−07 | B: 0.806E−12 | C: −0.525E−16 | |
| D: 0.434E−19 | E: −0.156E−22 | F: 0 | |
| 3: | 308.74 | 40.00 | 1.560772 |
| (aspherical) K: 0.102 | | | |
| A: −0.167E−08 | B: 0.788E−12 | C: −0.274E−16 | |
| D: −0.351E−20 | E: 0.354E−25 | F: 0 | |
| 4: | −313.98 | 17.21 | 1.0 |
| 5: | 246.56 | 25.00 | 1.560772 |
| 6: | 946.85 | 89.50 | 1.0 |
| 7: | 87.38 | 13.00 | 1.560772 |
| 8: | 84.94 | 15.00 | 1.0 |
| (aspherical) K: 0.000000 | | | |
| A: −0.128E−08 | B: 0.182E−10 | C: 0.746E−14 | |
| D: 0.288E−19 | E: −0.279E−22 | F: 0 | |
| 9: | −4922.29 | 13.00 | 1.560772 |
| 10: | 178.10 | 21.00 | 1.0 |
| (aspherical) K: −2.34 | | | |
| A: −0.481E−07 | B: −0.638E−10 | C: −0.104E−13 | |
| D: −0.200E−17 | E: 0.231E−20 | F: 0 | |
| 11: | −136.04 | 13.000000 | 1.560772 |
| (aspherical) K: 4.64 | | | |
| A: −0.142E−06 | B: 0.361E−12 | C: 0.143E−13 | |
| D: −0.549E−17 | E: 0.469E−20 | F: 0 | |
| 12: | 141.97 | 109.83 | 1.0 |
| 13: | −603.93 | 35.00 | 1.560772 |
| (aspherical) K: 0.154 | | | |
| A: −0.111E−09 | B: −0.399E−13 | C: −0.144E−17 | |
| D: 0.397E−21 | E: −0.247E−25 | F: 0.977E−25 | |
| 14: | −163.49 | 1.00 | 1.0 |
| (aspherical) K: 0.026 | | | |
| A: −0.111E−08 | B: 0.203E−14 | C: −0.140E−17 | |

| -continued | | | |
|---|---|---|---|
| Spec.: Magnification = 1/4, | NA = 0.50 | λ = 193.00 nm | |
| Surface Number | Curvature Radius | Surface Spacing | Refractivity (λ = 193.00 nm) |
| D: 0.136E−23 | E: 0.424E−25 | F: 0.347E−29 | |
| 15: STOP | INFINITY | 32.000000 | 1.0 |
| (Stop) | | | |
| 16: | 512.45 | 37.00 | 1.560772 |
| (aspherical) K: 0.478 | | | |
| A: 0.785E−09 | B: 0.260E−14 | C: 0.692E−18 | |
| D: 0.293E−22 | E: 0.178E−26 | F: −0.497E−30 | |
| 17: | −564.67 | 21.55 | 1.0 |
| (BOE) Design Order −1 λ = 632.80 nm | | | |
| C1: 2.146E−03 | C2: −4.714E−10 | C3: −1.840E−13 | |
| 18: | 1750.00 | 20.00 | 1.560772 |
| 19: | 629.89 | 142.99 | 1.0 |
| (BOE) Design Order −1 λp = 632.80 nm | | | |
| C1: 1.935E−03 | C2: 1.153E−09 | C3: 1.174E−13 | |
| 20: | 108.30 | 35.00 | 1.560772 |
| (aspherical) K: −0.212 | | | |
| A: −0.762E−09 | B: −0.470E−12 | C: −0.146E−15 | |
| D: −0.346E−20 | E: −0.157E−23 | F: 0 | |
| 21: | 405.11 | 40.57 | 1.0 |
| 22: | 121.43 | 30.00 | 1.560772 |
| 21: | 155.76 | 30.39 | 1.0 |
| (aspherical) K: −0.167 | | | |
| A: 0.114E−06 | B: −0.283E−10 | C: 0.251E−13 | |
| D: −0.804E−16 | E: 0.414E−19 | F: 0 | |
| 24: STOP | INFINITY | 0.000939 | |
| (IMG) | | | |

Figure 9:
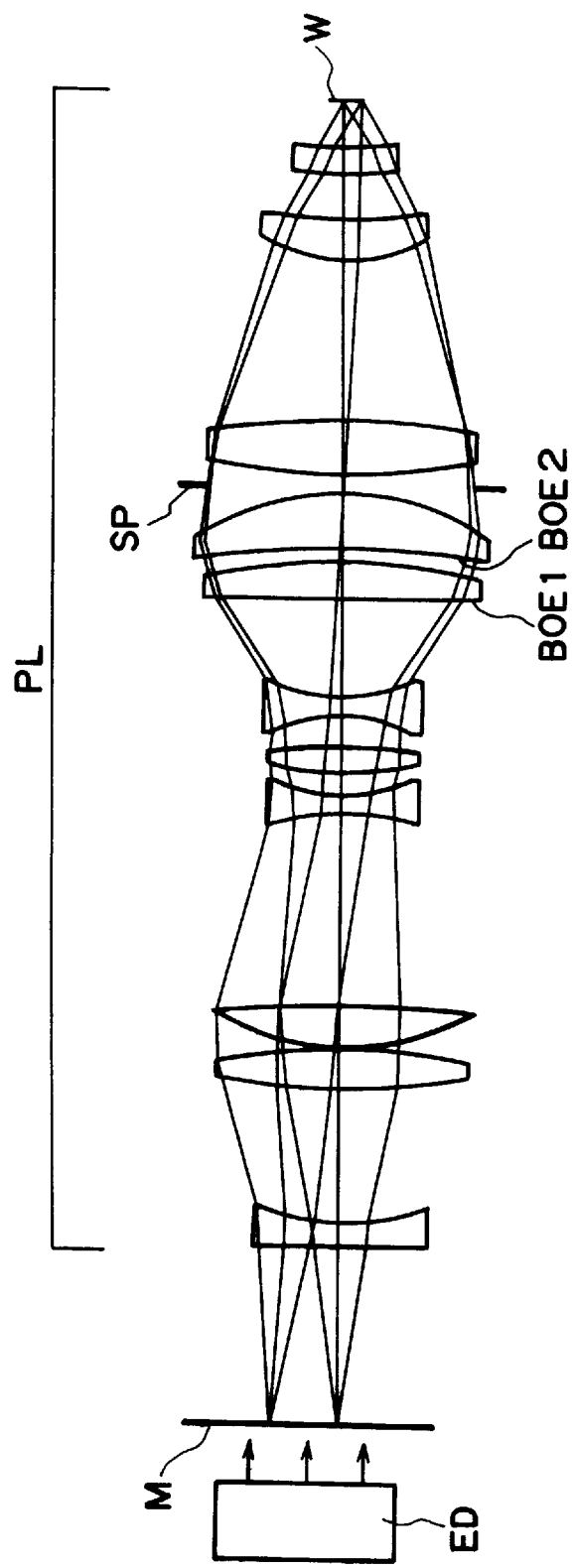
FIG. 9 is a schematic view of a main portion of a projection optical system according to a third embodiment of the present invention.

FIG. 9 is a schematic view of a main portion of an optical system according to a third embodiment of the present invention. This embodiment differs from the first embodiment of FIG. 1 in that diffractive optical elements BOE1 and BOE2 are provided on the surfaces of lenses which are disposed on the object side of the aperture stop SP. The remaining portion has essentially the same structure.

Figure 10:
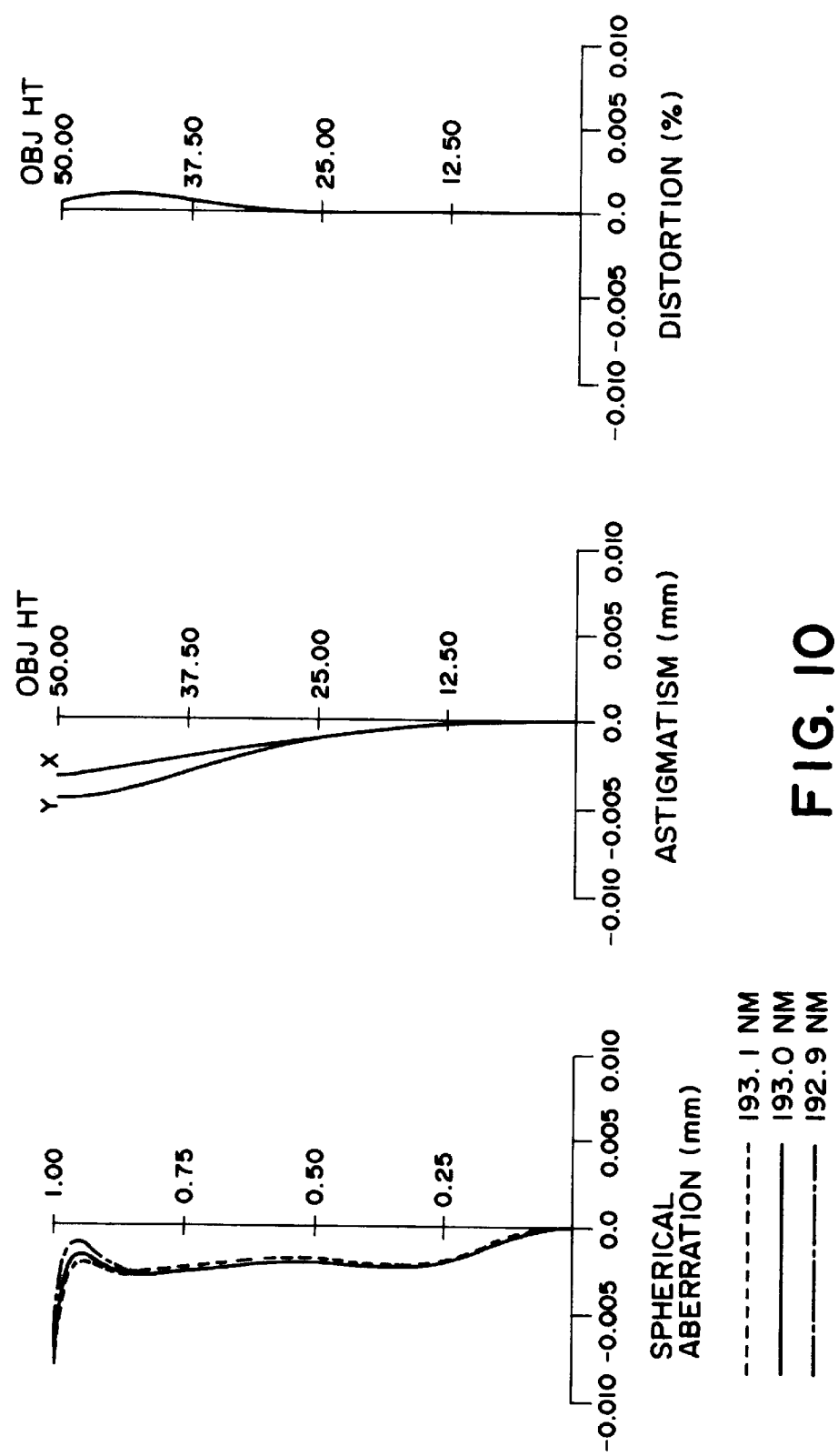
FIG. 10 shows spherical aberration, astigmatism and distortion of the projection optical system of the third embodiment of the present invention.
Figure 11:
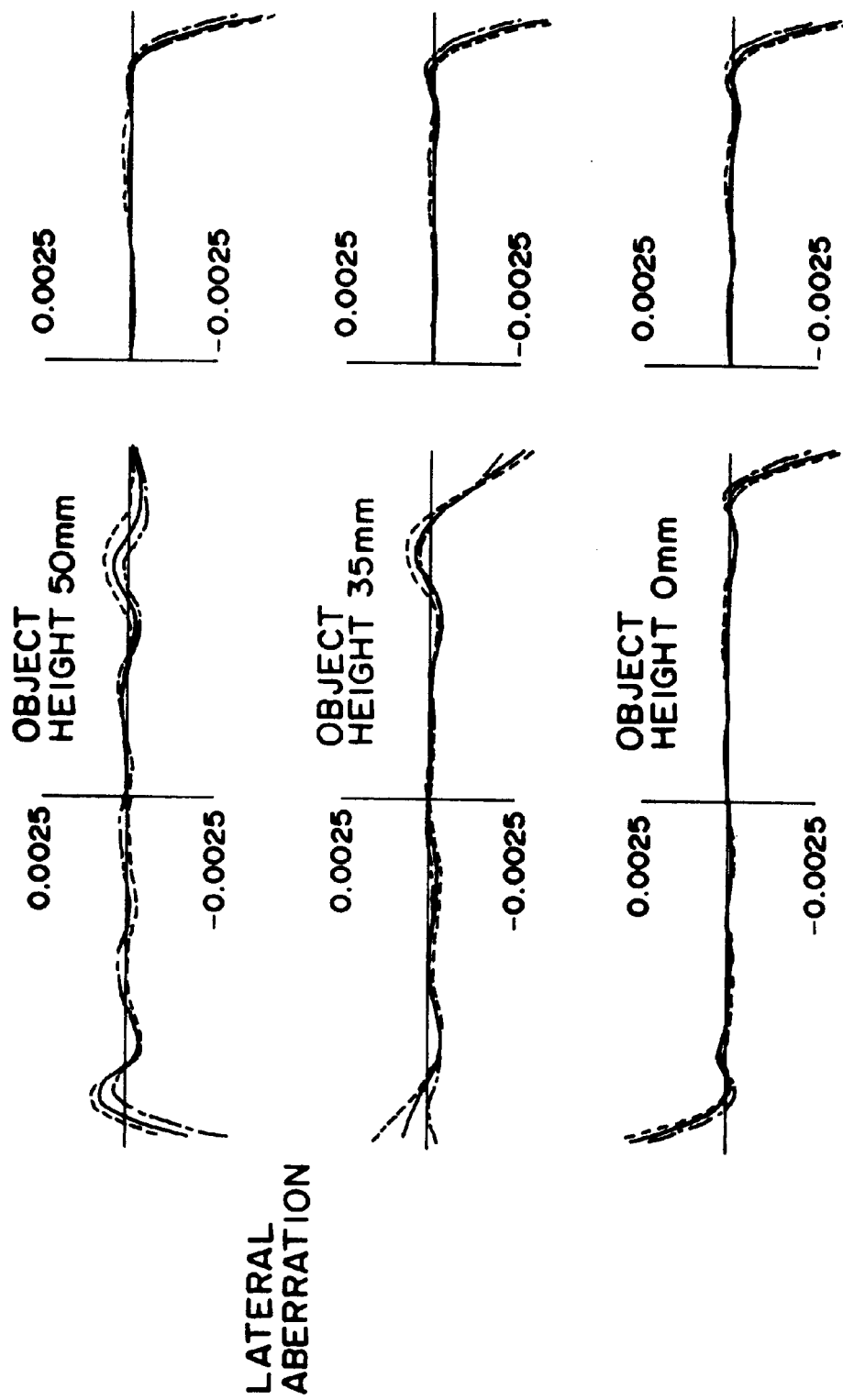
FIG. 11 shows lateral aberration of the projection optical system of the third embodiment of the present invention.

FIGS. 10 and 11 show aberrations of a numerical example (Numerical Example 3) according to this embodiment, to be described below. Although the optical system is provided by a single glass material, aberrations including chromatic aberration are well corrected.

Figure 12:
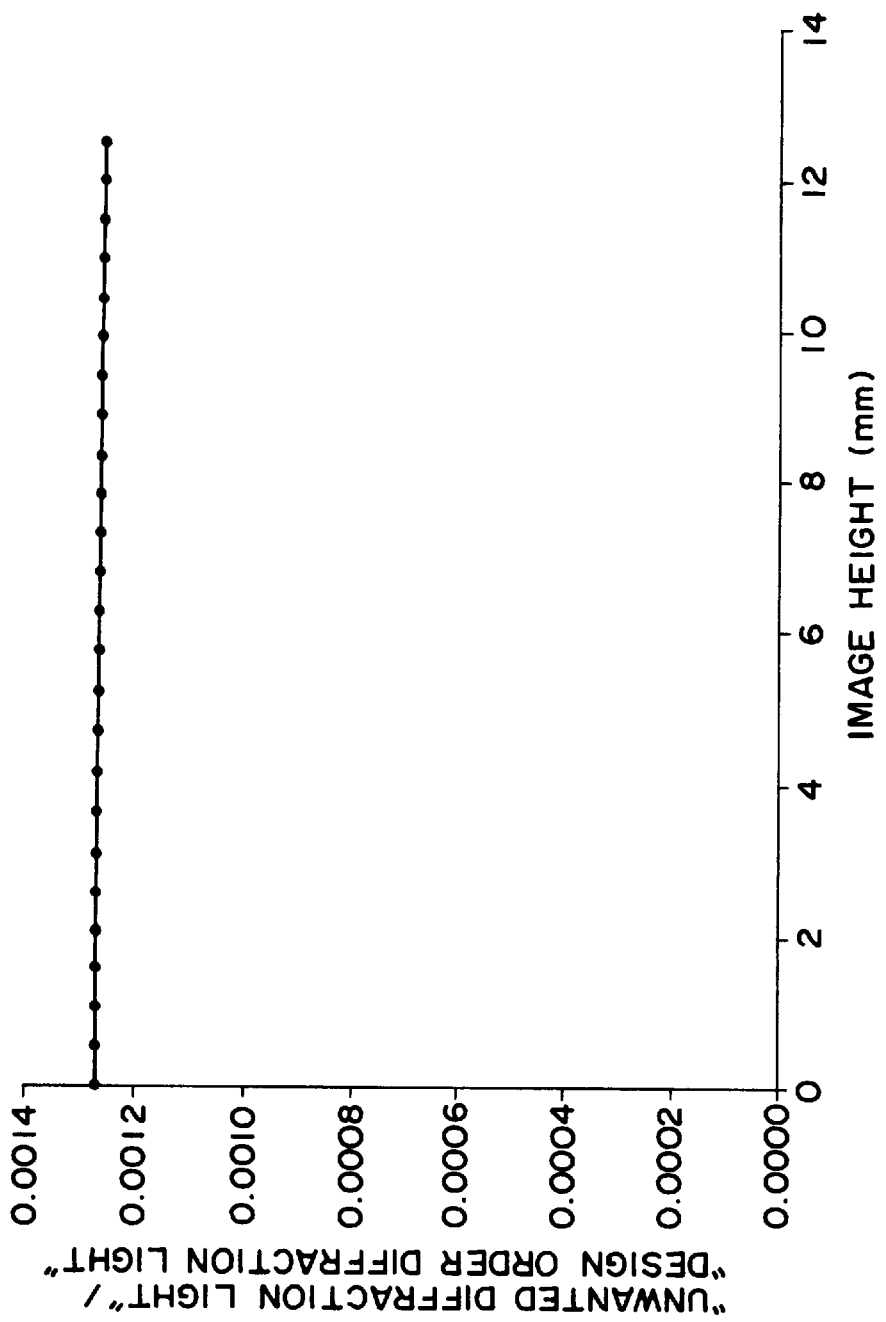
FIG. 12 shows an intensity distribution of unwanted diffraction light as defined on an image plane by the projection optical system of the third embodiment of the present invention.

FIG. 12 shows an intensity distribution of unwanted diffraction light upon the image plane, in this embodiment, wherein the intensity of unwanted light is illustrated as being standardized with respect to the intensity of diffraction light of a design order. Calculation of unwanted diffraction light here is based on that there is a circular opening of a radius 50 mm on the object plane and the luminance distribution and light orientation distribution are uniform over the whole circular opening, and that each of two diffractive optical elements has a step structure of eight levels.

It is seen from FIG. 12 that in this embodiment the intensity ratio of the unwanted diffraction light to the diffraction light of the design order is about 0.13% and it is substantially uniform over the whole image plane, and that the effect of the unwanted diffraction light is very small.

Figure 23:
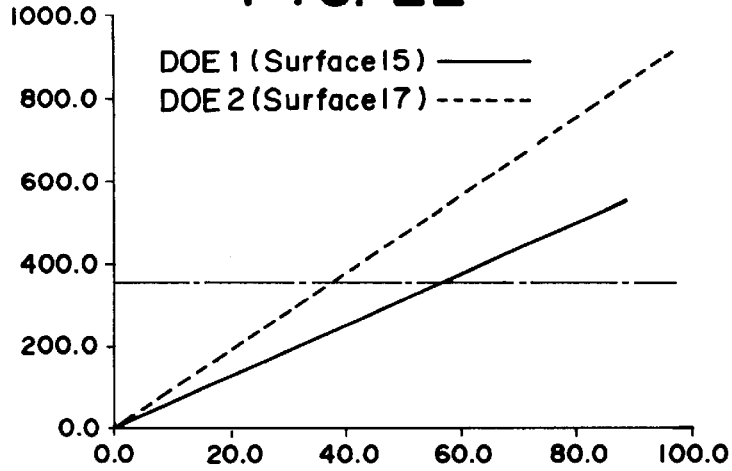
FIG. 23 is a graph for explaining the relation between effective radius and frequency of a diffractive optical element in the third embodiment of the present invention.

FIG. 23 shows the relation between the effective radius of the diffractive optical element and the frequency, in this embodiment.

Next, a numerical example (Numerical Example 3) according to this embodiment will be described.

NUMERICAL EXAMPLE 3

| Spec.: Magnification = 1/4, | NA = 0.50 | $\lambda$ = 193.00 nm |
|---|---|---|

| Surface Number | Curvature Radius | Surface Spacing | Refractivity ($\lambda$ = 193.00 nm) |
|---|---|---|---|
| OBJ: | INFINITY | 147.377 | 1.0 |
| 1: | −4548.42 | 15.00 | 1.560772 |
| 2: | 148.52 | 93.24 | 1.0 |
| (aspherical) K: −2.33 | | | |
| A: 0.860E−08 | B: −0.138E−11 | C: 0.121E−15 | |
| D: 0.228E−19 | E: −0.661E−23 | F: 0 | |
| 3: | 423.51 | 30.00 | 1.560772 |
| (aspherical) K: −1.266 | | | |
| A: −0.699E−08 | B: −0.112E−12 | C: 0.818E−17 | |
| D: 0.103E−20 | E: 0.276E−25 | F: 0 | |
| 4: | −474.05 | 0.21 | 1.0 |
| 5: | 198.61 | 30.00 | 1.560772 |
| 6: | −808.86 | 131.96 | 1.0 |
| 7: | −208.81 | 13.00 | 1.560772 |
| 8: | 128.08 | 15.00 | 1.0 |
| (aspherical) K: 0.000000 | | | |
| A: −0.254E−07 | B: 0.251E−10 | C: 0.957E−14 | |
| D: 0.459E−18 | E: −0.477E−21 | F: 0 | |
| 9: | 206.71 | 18.00 | 1.560772 |
| 10: | −710.89 | 21.00 | 1.0 |
| (aspherical) K: 109.58 | | | |
| A: −0.591E−07 | B: −0.569E−10 | C: −0.126E−13 | |
| D: −0.115E−17 | E: 0.189E−20 | F: 0 | |
| 11: | −142.69 | 13.000000 | 1.560772 |
| (aspherical) K: 4.75 | | | |
| A: −0.109E−06 | B: 0.208E−10 | C: 0.117E−13 | |
| D: −0.838E−17 | E: 0.522E−20 | F: 0 | |
| 12: | 122.15 | 70.97 | 1.0 |
| 13: | INFINITY | 25.00 | 1.560772 |
| (BOE) Design Order −1 $\lambda p$ = −632.80 nm | | | |
| C1: 1.997E−03 | C2: 8.375E−10 | C3: −1.522E−13 | |
| 14: | −437.15 | 9.21 | 1.0 |
| 15: | −717.05 | 40.00 | 1.560772 |
| (BOE) Design Order −1 $\lambda p$ = 632.80 nm | | | |
| C1: 3.000E−03 | C2: −2.263E−09 | C3: 2.118E−13 | |
| 16: | −185.12 | 5.00 | 1.560772 |
| (aspherical) K: −0.0028 | | | |
| A: 0.604E−09 | B: 0.148E−12 | C: 0.905E−17 | |
| D: 0.253E−21 | E: −0.145E−25 | F: −0.781E−30 | |
| 17: STOP | INFINITY | 10.000000 | 1.0 |
| (Stop) | | | |
| 18: | 534.58 | 37.00 | 1.560772 |
| (aspherical) K: −0.778 | | | |
| A: 0.177E−09 | B: −0.933E−13 | C: −0.568E−17 | |
| D: −0.113E−21 | E: −0.398E−26 | F: −0.716E−29 | |
| 19: | −589.91 | 113.05 | 1.0 |
| (aspherical) K: −0.9515 | | | |
| A: 0.889E−09 | B: 0.557E−13 | C: 0.133E−17 | |
| D: −0.306E−21 | E: 0.298E−25 | F: 0 | |
| 20: | 102.95 | 30.00 | 1.560772 |
| (aspherical) K: −0.236 | | | |
| A: 0.719E−09 | B: −0.318E−11 | C: −0.675E−15 | |
| D: −0.752E−19 | E: −0.309E−22 | F: 0 | |
| 21: | 318.28 | 32.79 | 1.0 |
| 22: | 230.0 | 20.00 | 1.560772 |
| 23: | 350.93 | 33.58 | 1.0 |
| (aspherical) K: −18.95 | | | |
| A: 0.107E−06 | B: −0.977E−10 | C: 0.337E−13 | |
| D: −0.799E−16 | E: 0.340E−19 | F: 0 | |
| 24: IMG: | INFINITY | −0.0024 | |
| (IMAGE PLANE) | | | |

Figure 13:
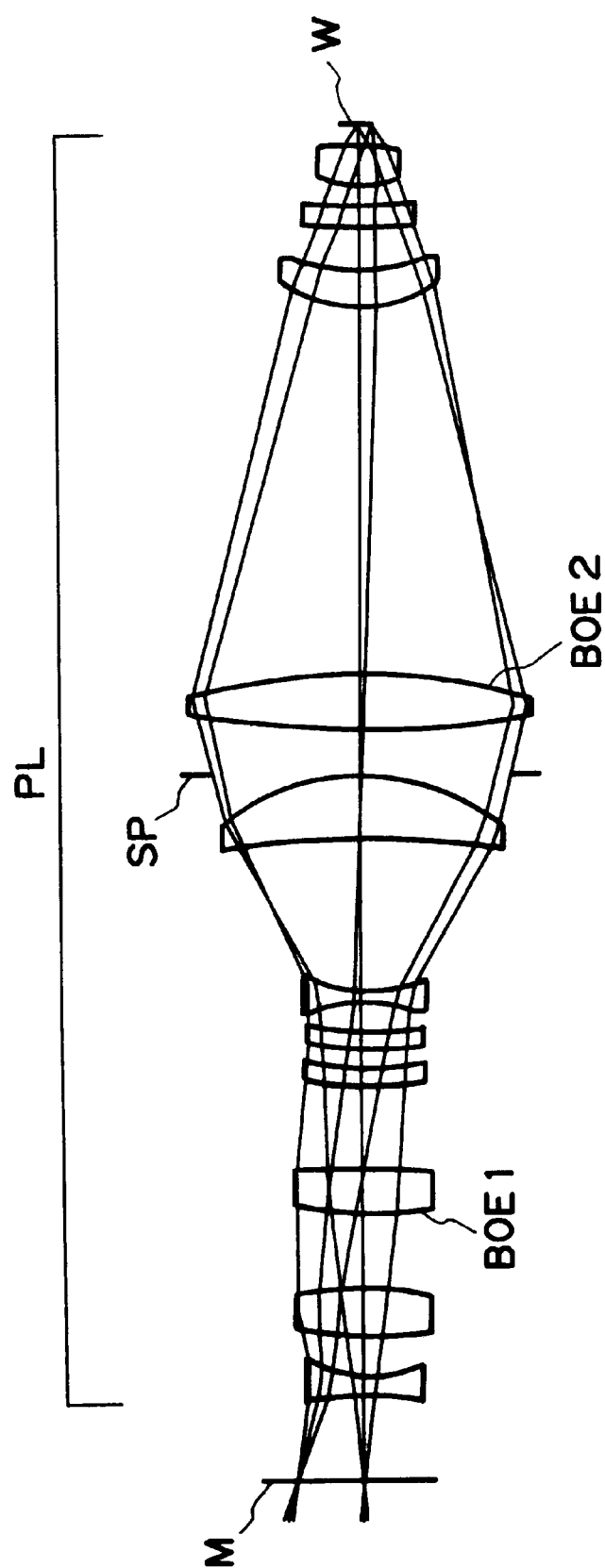
FIG. 13 is a schematic view of a main portion of a projection optical system to be compared with the present invention.

FIG. 13 is a schematic view of an optical system which is to be compared for reference with the projection optical systems according to the numerical examples 1–3 above. In FIG. 13, diffractive optical elements BOE1 and BOE2 are provided on the surface of one lens, which is on the object side of the aperture stop SP and is far remote from it, and on the surface of another lens which is on the image plane side of the aperture stop SP and is adjacent to it.

Figure 14:
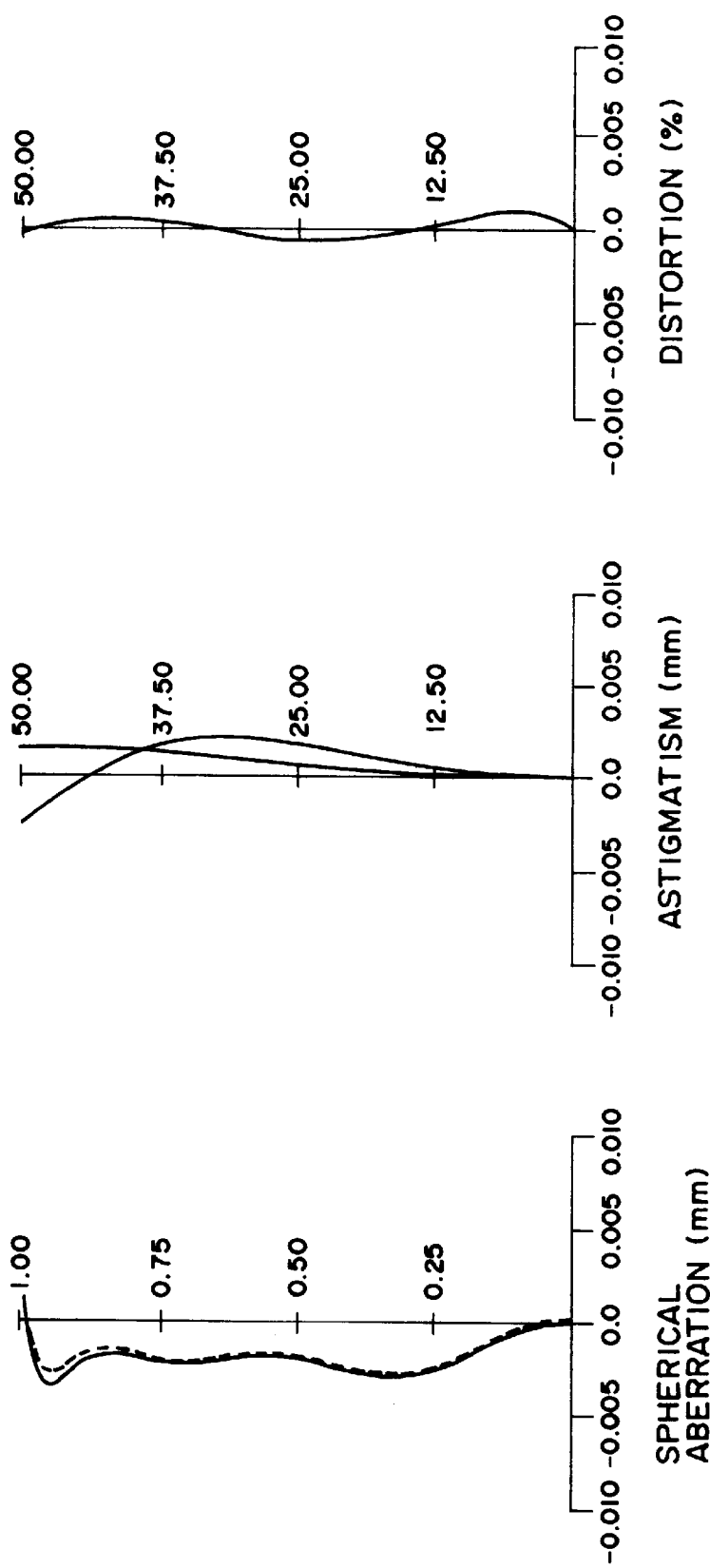
FIG. 14 shows aberrations of a projection optical system to be compared with the present invention.
Figure 15:
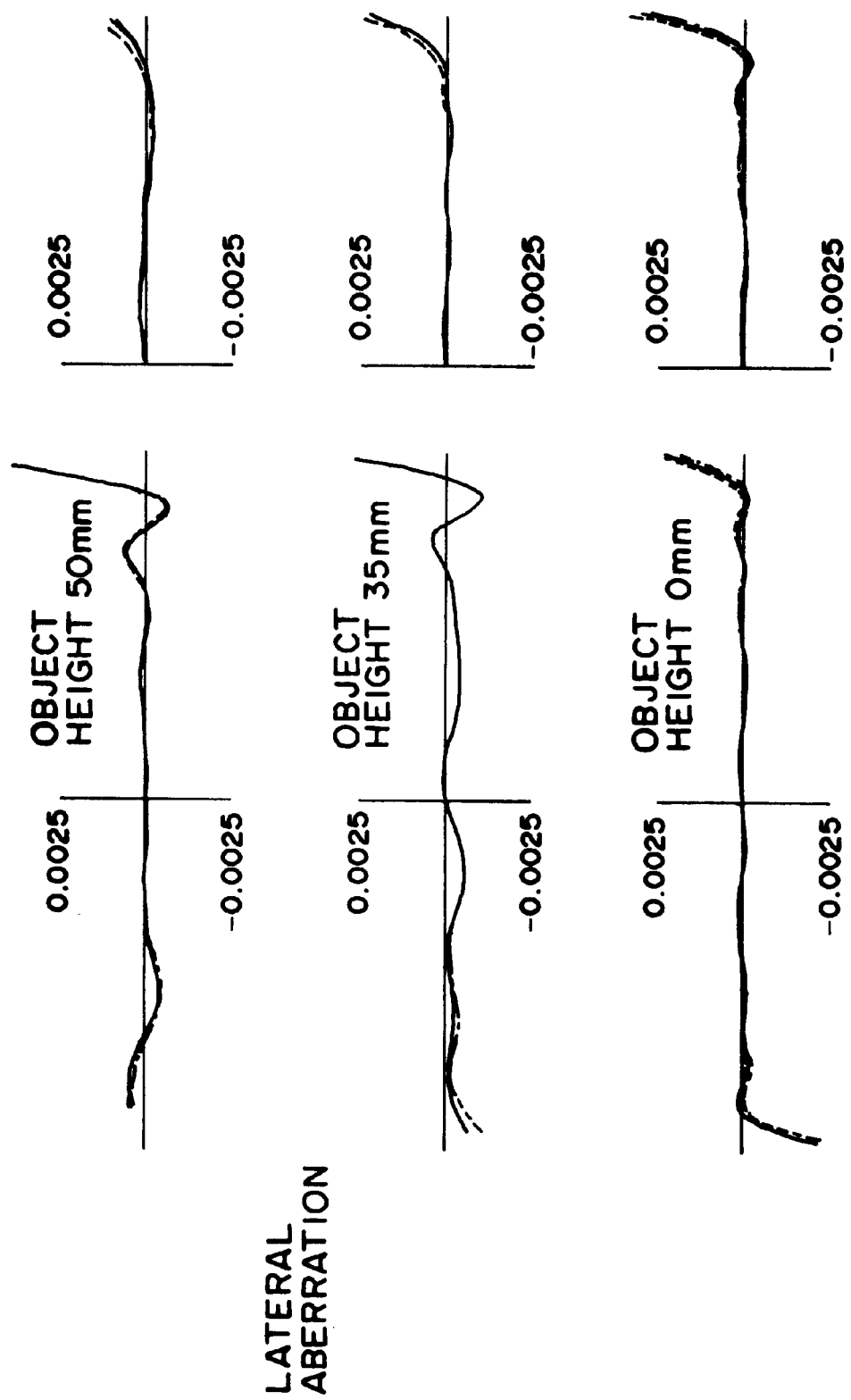
FIG. 15 shows lateral aberration of a projection optical system to be compared with the present invention.

FIGS. 14 and 15 show aberrations of the reference example of the projection optical system shown in FIG. 13. It is seen that, although the optical system is provided by a single glass material, aberrations including chromatic aberration are well corrected.

Figure 16:
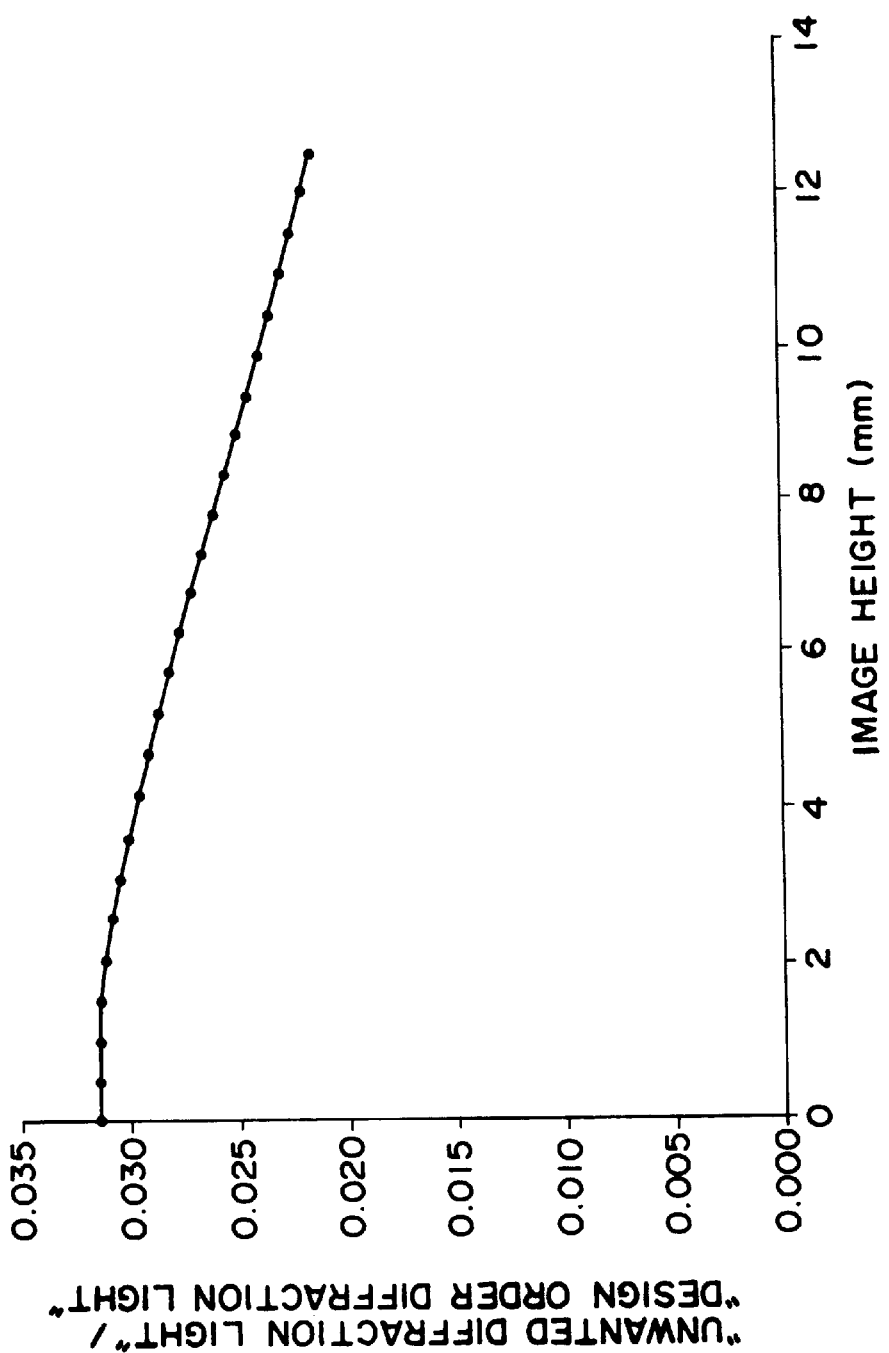
FIG. 16 shows an intensity distribution of unwanted diffraction light as defined on an image plane by a projection optical system to be compared with the present invention.

FIG. 16 shows an intensity distribution of unwanted diffraction light upon the image plane, in this reference example, wherein the intensity of unwanted light is illustrated as being standardized with respect to the intensity of diffraction light of the design order. Calculation of unwanted diffraction light here is based on that there is a circular opening of a radius 50 mm on the object plane and the luminance distribution and light orientation distribution are uniform over the whole circular opening, and that each of two diffractive optical elements has a step structure of eight levels.

It is seen from FIG. 16 that in this example the intensity ratio of the unwanted diffraction light to the diffraction light of the design order is about 3.2% at the center of the picture field, and that, regarding the uniformness of intensity ratio on the image plane, there is a difference of about 1% between the central portion and the peripheral portion. Such an intensity ratio and its uniformness are insufficient for a projection exposure apparatus for submicron or quartermicron order lithography.

Figure 24:
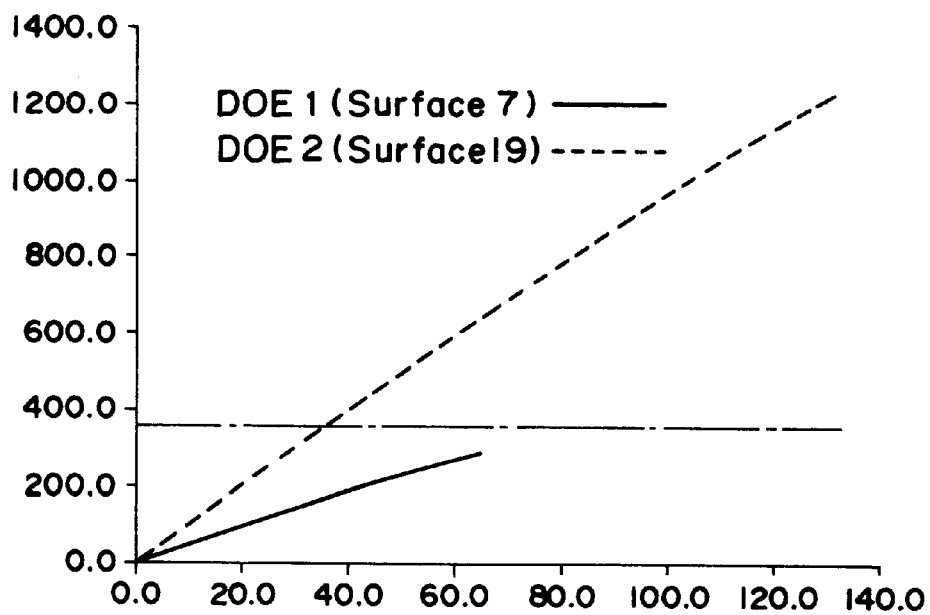
FIG. 24 is a graph for explaining the relation between effective radius and frequency of a diffractive optical element in a projection optical system to be compared with the present invention.

FIG. 24 shows the relation between the effective radius of the diffractive optical element and the frequency, in the case wherein the projection optical system shown in FIG. 13 is used. Numerical data of the reference example where the projection optical system of FIG. 13 is used, will be described below.

Numerical Data of Reference Example

| Spec.: Magnification = 1/4, | NA = 0.50 | $\lambda$ = 193.00 nm |
|---|---|---|

| Surface Number | Curvature Radius | Surface Spacing | Refractivity ($\lambda$= 193.00 nm) |
|---|---|---|---|
| OBJ: | INFINITY | 66.934 | 1.0 |
| 1: | −247.81 | 15.00 | 1.560772 |
| 2: | 84.43 | 81.29 | 1.0 |
| (aspherical) K: −2.15 | | | |
| A: 0.476E−08 | B: −0.522E−11 | C: 0.132E−14 | |
| D: −0.239E−18 | E: 0.277E−22 | F: 0 | |
| 3: | 343.68 | 35.00 | 1.560772 |
| (aspherical) K: −3.248 | | | |
| A: −0.115E−07 | B: 0.722E−12 | C: −0.178E−17 | |
| D: −0.692E−20 | E: −0.192E−24 | F: 0 | |
| 4: | −223.10 | 54.65 | 1.0 |
| (aspherical) K: −0.076 | | | |
| A: 0.148E−08 | B: 0.212E−12 | C: −0.449E−16 | |
| D: −0.149E−20 | E: 0.116E−23 | F: −0.228E−27 | |
| 5: | 232.87 | 31.60 | 1.560772 |
| (BOE) Design Order −1 $\lambda p$ = 632.80 nm | | | |
| C1: −1.540E−03 | C2: 4.054E−09 | C3: 4.625E−13 | |
| 6: | −1003.71 | 61.93 | 1.0 |
| 7: | 322.97 | 12.00 | 1.560772 |
| 8: | 171.11 | 14.75 | 1.0 |
| (aspherical) K: 0.000000 | | | |
| A: −0.184E−07 | B: 0.159E−10 | C: 0.679E−14 | |
| D: −0.233E−17 | E: 0.637E−22 | F: 0 | |
| 9: | 317.08 | 12.500 | 1.560772 |
| 10: | 176.95 | 20.88 | 1.0 |
| (aspherical) K: −3.802 | | | |
| A: −0.654E−07 | B: −0.655E−10 | C: −0.109E−13 | |
| D: −0.175E−17 | E: 0.158E−20 | F: 0 | |
| 11: | −137.87 | 10.750000 | 1.560772 |
| (aspherical) K: 4.32 | | | |
| A: −0.129E−06 | B: −0.104E−10 | C: 0.151E−13 | |
| D: −0.108E−16 | E: 0.422E−20 | F: 0 | |

-continued

| Spec.: Magnification = 1/4, | NA = 0.50 | λ = 193.00 nm | |
|---|---|---|---|
| Surface Number | Curvature Radius | Surface Spacing | Refractivity (λ= 193.00 nm) |
| 12: | 145.47 | 109.56 | 1.0 |
| (aspherical) K: −0.0333 | | | |
| A: −0.130E−08 | B: −0.158E−11 | C: −0.375E−15 | |
| D: 0.308E−19 | E: 0.283E−22 | F: −0.104E−25 | |
| 13: | −572.00 | 45.00 | 1.560772 |
| (aspherical) K: 0.117 | | | |
| A: −0.854E−10 | B: −0.114E−13 | C: 0.985E−18 | |
| D: 0.106E−21 | E: 0.131E−26 | F: −0.257E−25 | |
| 14: | −173.10 | 1.00 | 1.0 |
| (aspherical) K: 0.008 | | | |
| A: −0.127E−09 | B: 0.851E−14 | C: −0.242E−17 | |
| D: −0.961E−22 | E: −0.183E−27 | F: −0.680E−30 | |
| 15: STOP (Stop) | INFINITY | 32.800000 | 1.0 |
| 16: | 718.77 | 42.19 | 1.560772 |
| (aspherical) K: −0.261 | | | |
| A: 0.453E−09 | B: −0.174E−13 | C: −0.416E−18 | |
| D: −0.103E−21 | E: 0.591E−26 | F: −0.102E−30 | |
| 17: | −476.54 | 267.46 | 1.0 |
| (BOE) Design Order −1 λp = 632.80 nm | | | |
| C1: 3.164E−03 | C2:−4.434E−11 | C3: −1.147E−13 | |
| 20: | 93.29 | 30.34 | 1.560772 |
| (aspherical) K: −0.200 | | | |
| A: 0.174E−09 | B: −0.208E−12 | C: −0.121E−14 | |
| D: 0.235E−18 | E: −0.507E−22 | F: 0 | |
| 21: | 163.11 | 29.87 | 1.0 |
| 22: | 677.38 | 16.00 | 1.560772 |
| 23: | 270.97 | 15.07 | 1.0 |
| 24: | 78.47 | 30.00 | 1.560772 |
| 25: | INFINITY | 9.50 | 1.0 |
| (aspherical) K: −0.813 | | | |
| A: 0.428E−07 | B: 0.276E−11 | C: −0.387E−11 | |
| D: 0.108E−13 | E: −0.108E−16 | F: 0 | |
| 26: IMG: (IMAGE PLANE) | INFINITY | −0.0024 | |

Figure 17:
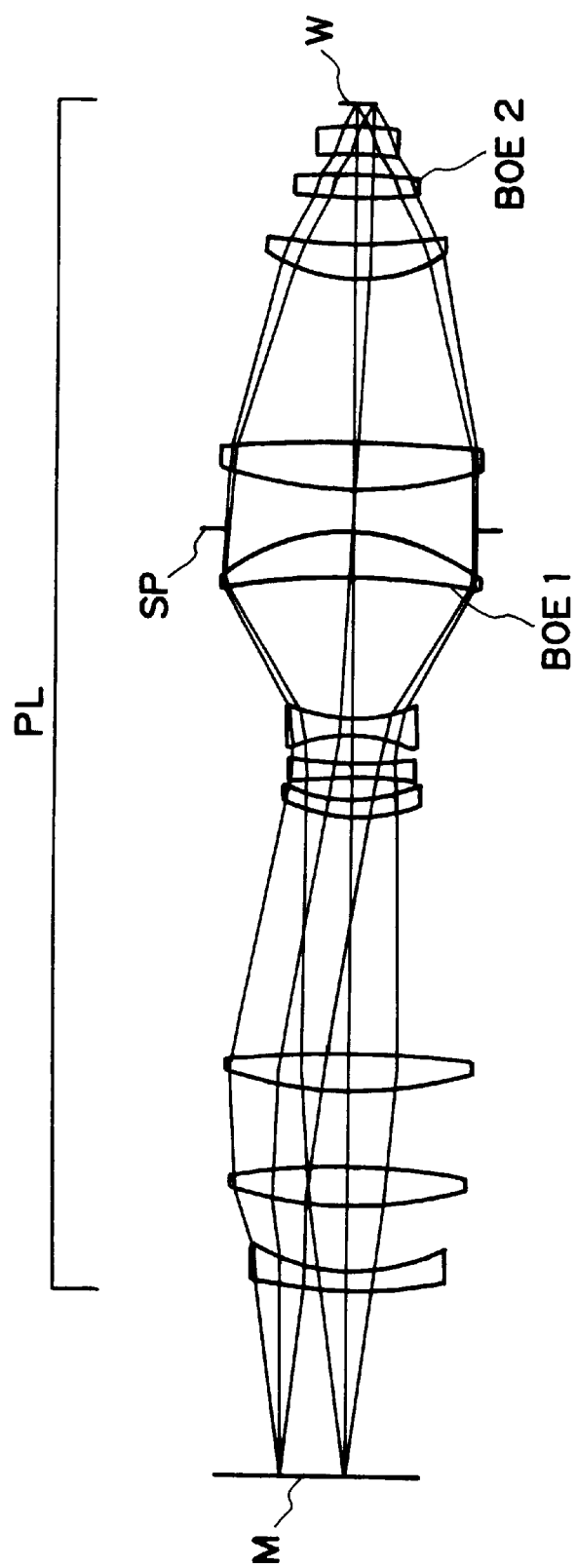
FIG. 17 is a schematic view of a main portion of another projection optical system to be compared with the present invention.

FIG. 17 is a schematic view of another optical system which is to be compared for reference with the projection optical systems according to the numerical examples 1–3 described above. In FIG. 17, diffractive optical elements BOE1 and BOE2 are provided on the surface of one lens, which is on the object side of the aperture stop SP and is adjacent to, and on the surface of another lens which is on the image plane side of the aperture stop SP and is far remote from it.

Figure 18:
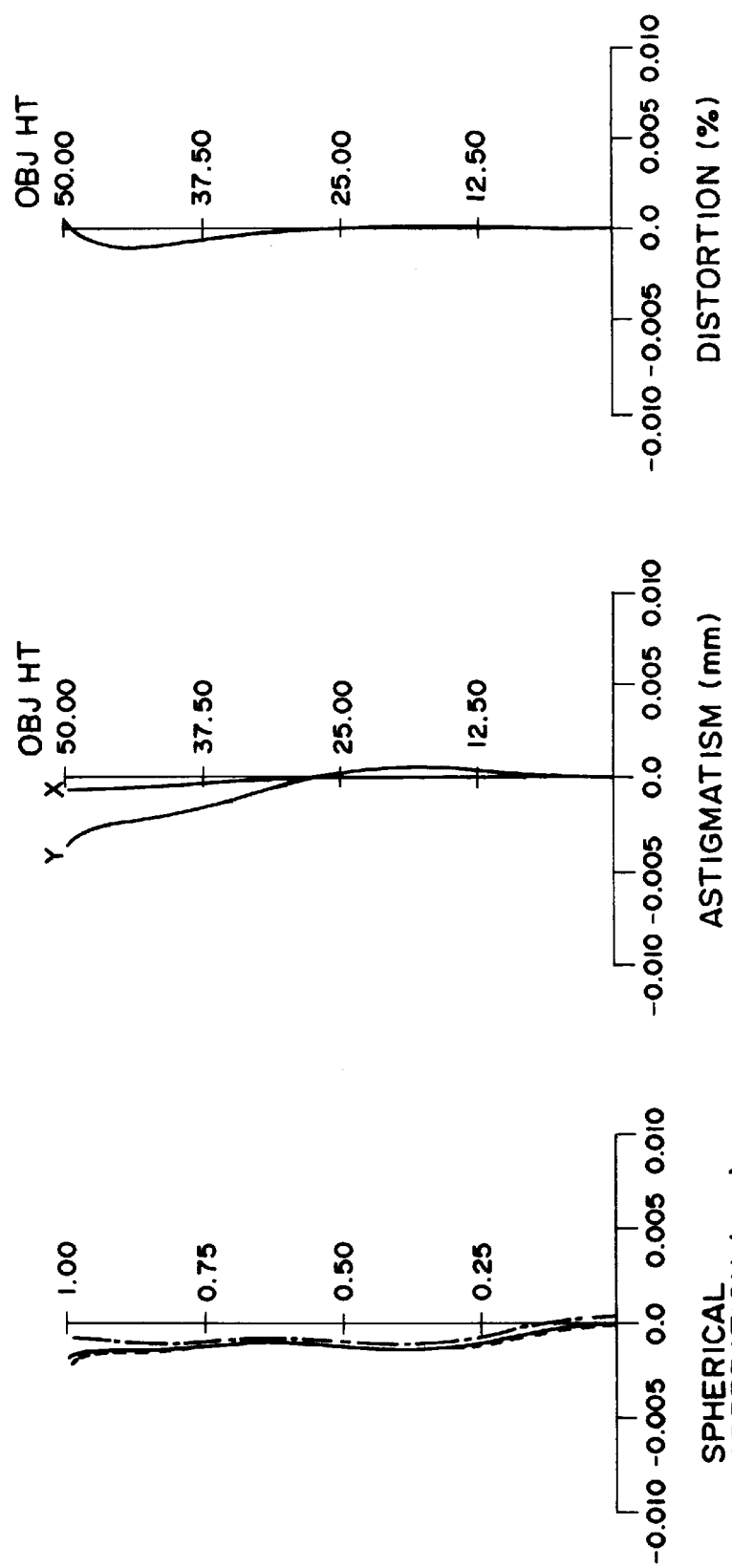
FIG. 18 shows aberrations of a projection optical system to be compared with the present invention.
Figure 19:
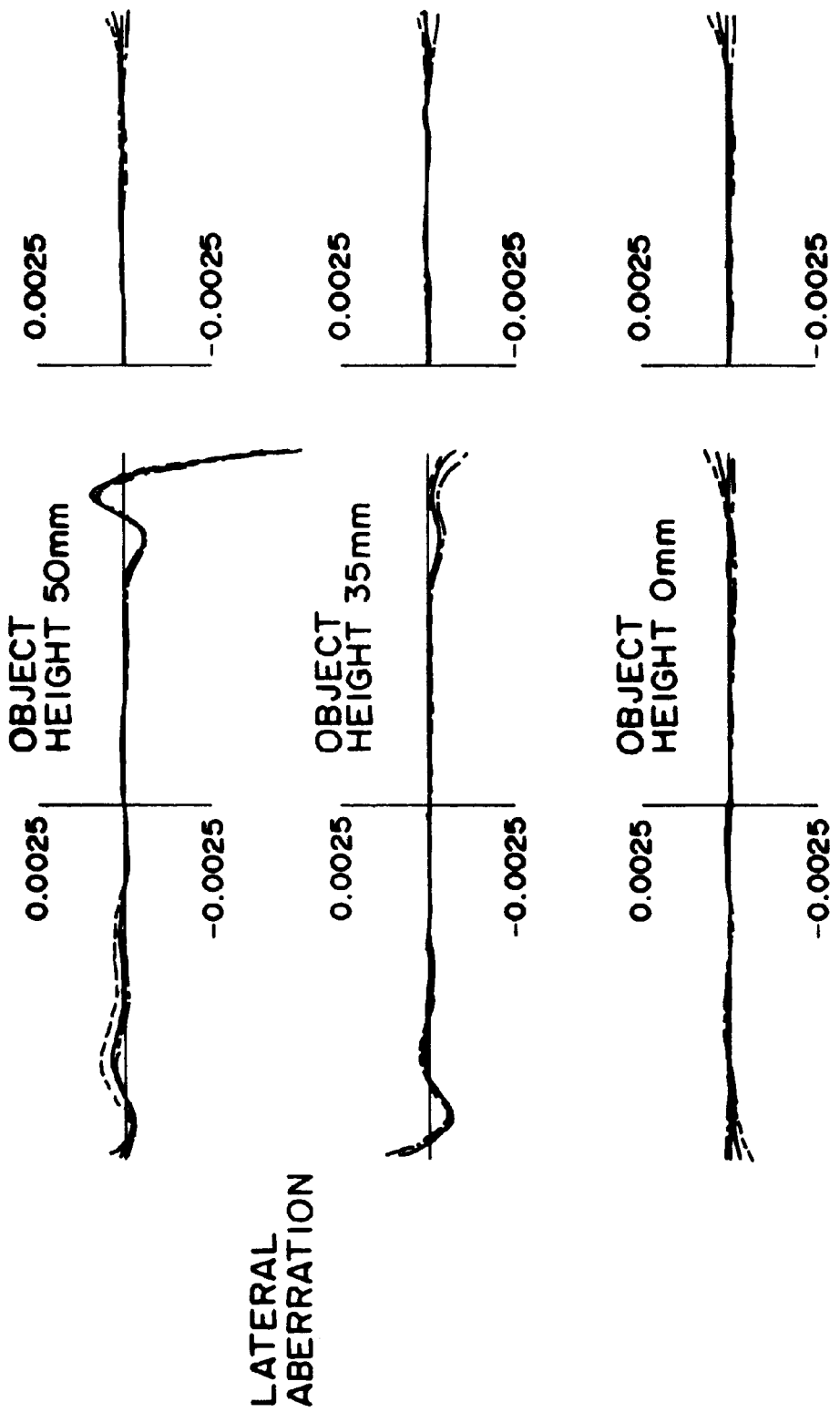
FIG. 19 shows lateral aberration of a projection optical system to be compared with the present invention.

FIGS. 18 and 19 show aberrations of the reference example of a projection optical system shown in FIG. 17. It is seen that, although the optical system is provided by a single glass material, aberrations including chromatic aberration are well corrected.

Figure 20:
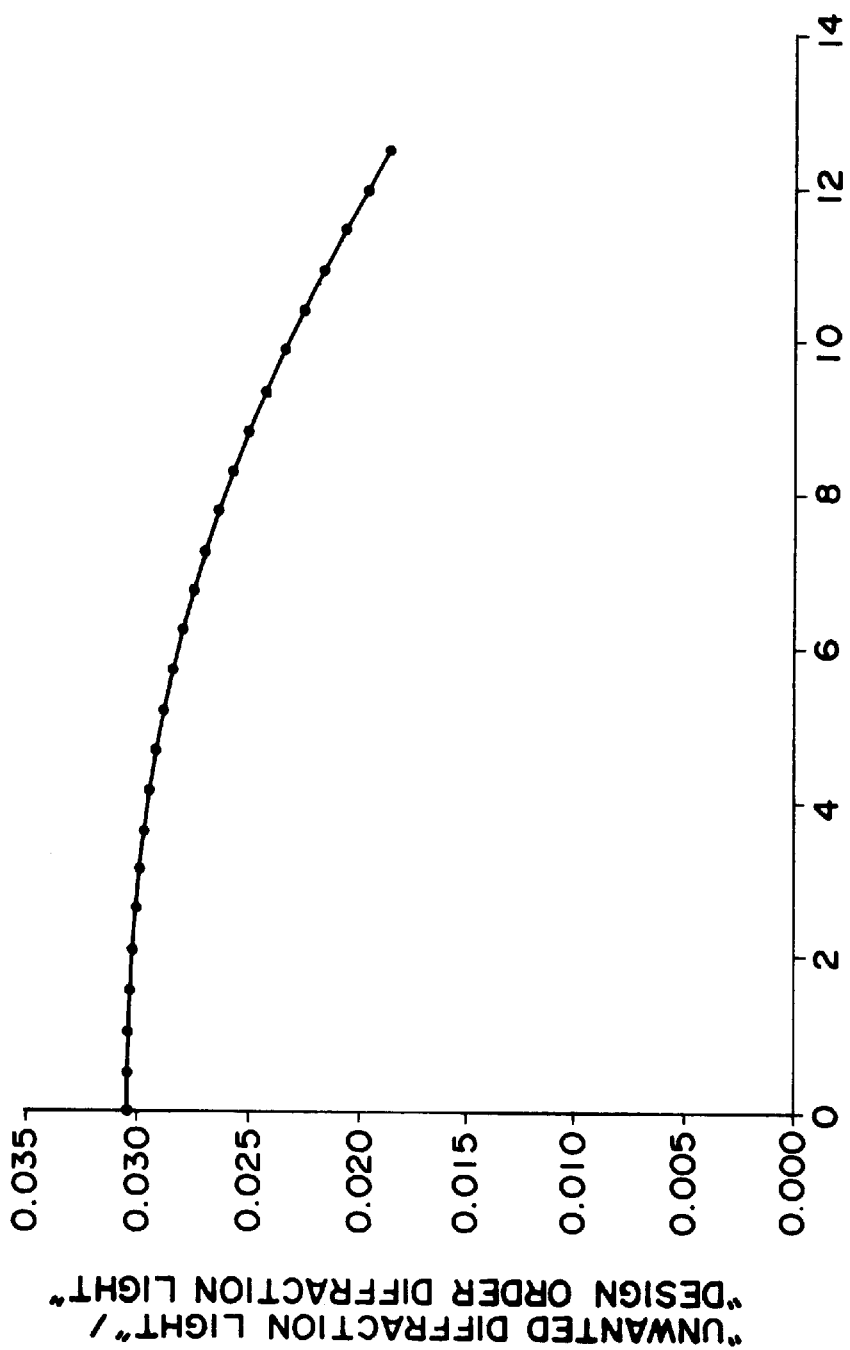
FIG. 20 shows an intensity distribution of unwanted diffraction light as defined on an image plane by a projection optical system to be compared with the present invention.

FIG. 20 shows an intensity distribution of unwanted diffraction light upon the image plane, in this reference example, wherein the intensity of unwanted light is illustrated as being standardized with respect to the intensity of diffraction light of a design order. Calculation of unwanted diffraction light here is based on that there is a circular opening of a radius 50 mm on the object plane and the luminance distribution and light orientation distribution are uniform over the whole circular opening, and that each of two diffractive optical elements has a step structure of eight levels.

It is seen from FIG. 20 that in this example the intensity ratio of the unwanted diffraction light to the diffraction light of the design order is about 3% at the center of the picture field, and that, regarding the uniformness of intensity ratio on the image plane, there is a difference of more than about 1.2% between the central portion and the peripheral portion. Such an intensity ratio and its uniformness are insufficient for a projection exposure apparatus for submicron or quartermicron order lithography.

Figure 25:
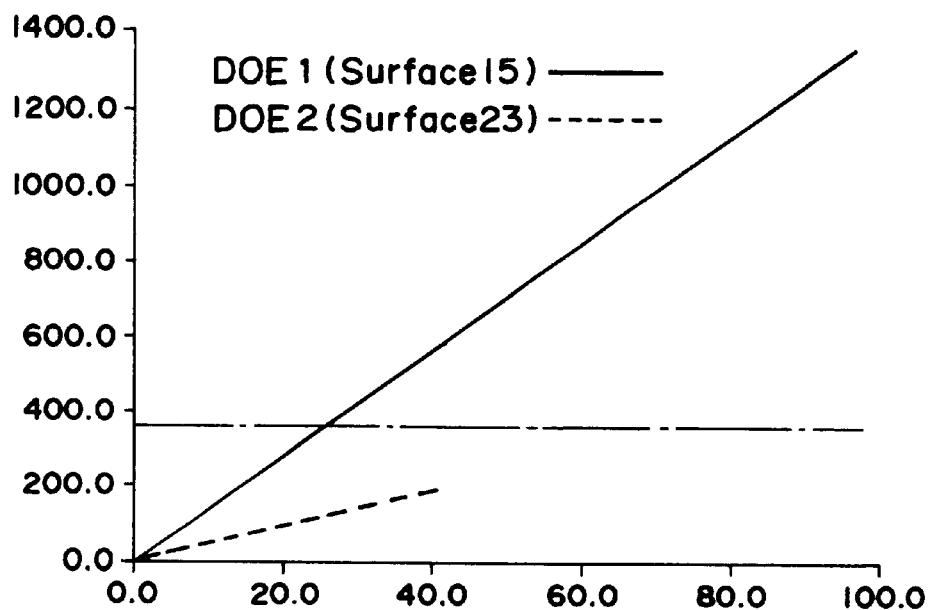
FIG. 25 is a graph for explaining the relation between effective radius and frequency of a diffractive optical element in another projection optical system to be compared with the present invention.

FIG. 25 shows the relation between the effective radius of the diffractive optical element and the frequency, in the case wherein the projection optical system shown in FIG. 17 is used. Numerical data of the reference example where the projection optical system of FIG. 17 is used, will be described below.

Numerical Data of Second Reference Example

| Spec.: Magnification = 1/4, NA = 0.50 | | λ = 193.00 nm | |
|---|---|---|---|
| Surface Number | Curvature Radius | Surface Spacing | Refractivity (λ = 193.00 nm) |
| OBJ: | INFINITY | 148.522 | 1.0 |
| 1: | 364.94 | 15.00 | 1.560772 |
| 2: | 144.69 | 49.105 | 1.0 |
| (aspherical) K: −1.67 | | | |
| A: 0.269E−07 | B: −0.934E−12 | C: −0.422E−16 | |
| D: 0.180E−19 | E: −0.336E−23 | F: 0 | |
| 3: | 310.34 | 30.00 | 1.560772 |
| (aspherical) K: 0.437 | | | |
| A: 0.117E−08 | B: −0.222E−12 | C: −0.118E−16 | |
| D: 0.143E−20 | E: −0.256E−24 | F: 0 | |
| 4: | −548.43 | 58.28 | 1.0 |
| 5: | 299.43 | 30.00 | 1.560772 |
| 6: | −721.07 | 184.57 | 1.0 |
| 7: | 140.06 | 13.00 | 1.560772 |
| 8: | 125.44 | 15.00 | 1.0 |
| (aspherical) K: 0.000000 | | | |
| A: −0.510E−08 | B: 0.208E−10 | C: 0.926E−14 | |
| D: −0.113E−17 | E: 0.184E−21 | F: 0 | |
| 9: | −1018.49 | 13.00 | 1.560772 |
| 10: | 231.49 | 21.00 | 1.0 |
| (aspherical) K: 0.398 | | | |
| A: −0.254E−07 | B: −0.734E−10 | C: −0.151E−13 | |
| D: −0.259E−17 | E: 0.232E−20 | F: 0 | |
| 11: | −143.54 | 13.00 | 1.560772 |
| (aspherical) K: 4.85 | | | |
| A: −0.140E−06 | B: −0.180E−10 | C: 0.105E−13 | |
| D: −0.817E−17 | E: 0.503E−20 | F: 0 | |
| 12: | 127.31 | 109.09 | 1.0 |
| 13: | −605.58 | 35.00 | 1.560772 |
| (BOE) Design Order −1 λp = −632.80 nm | | | |
| C1: 4.471E−03 | C2: −2.739E−09 | C3: 1.234E−13 | |
| 14: | −166.85 | 1.00 | 1.0 |
| (aspherical) K: −0.0002 | | | |
| A: −0.658E−09 | B: 0.235E−12 | C: 0.704E−17 | |
| D: 0.186E−22 | E: −0.147E−26 | F: −0.555E−31 | |
| 15: STOP (Stop) | INFINITY | 32.00 | 1.0 |
| 16: | 322.05 | 37.00 | 1.560772 |
| (aspherical) K: 0.6368 | | | |
| A: 0.112E−08 | B: −0.551E−13 | C: 0.271E−17 | |
| D: 0.104E−21 | E: −0.287E−25 | F: −0.102E−30 | |
| 17: | −1103.52 | 126.01 | 1.0 |
| (aspherical) K: −0.533 | | | |
| A: 0.618E−10 | B: −0.200E−14 | C: 0.234E−18 | |
| D: 0.569E−22 | E: 0.664E−26 | F: −0.834E−31 | |
| 18: | 114.88 | 30.00 | 1.560772 |
| (aspherical) K: −0.271 | | | |
| A: −0.824E−08 | B: −0.830E−13 | C: −0.75E−17 | |
| D: −0.889E−20 | E: −0.200E−22 | F: 0 | |
| 19: | 514.74 | 36.12 | 1.0 |
| (aspherical) K: 9.51 | | | |
| A: 0.122E−07 | B: 0.268E−11 | C: 0.903E−16 | |
| D: −0.130E−18 | E: −0.241E−22 | F: 0 | |
| 20: | 687.47 | 18.00 | 1.560772 |
| 21: | −555.18 | 16.74 | 1.0 |
| (BOE) Design Order −1 λp = −632.80 nm | | | |
| C1: 1.542E−03 | C2: 1.224E−08 | C3: −9.748E−12 | |
| 22: | −287.19 | 20.00 | 1.560772 |

-continued

| Spec.: Magnification = 1/4, NA = 0.50 λ = 193.00 nm | | | |
|---|---|---|---|
| Surface Number | Curvature Radius | Surface Spacing | Refractivity (λ = 193.00 nm) |
| 23: | −1580.54 (aspherical) K: −120.54 A: 0.155E−06 B: −0.454E−09 C: 0.480E−12 D: −0.672E−15 E: 0.400E−18 F: 0 | 18.88 | 1.0 |
| 24: IMG: (IMAGE PLANE) | INFINITY | −0.0024 | |

Next, the relation between the conditions of equations (1) and (2) or (1') and (2') and the numerical examples 1, 2 and 3, described above, will be explained.

TABLE 1

| | NUMERICAL EXAMPLES | | |
|---|---|---|---|
| CONDITIONS | #1 | #2 | #3 |
| (1) $d_i/D$   $d_1/D$ | 0.04 | 0.07 | 0.08 |
| $d_2/D$ | 0.07 | 0.11 | 0.05 |
| (2) $h_i/H$   $h_1/H$ | 0.94 | 1.09 | 0.91 |
| $h_2/h$ | 1.01 | 1.00 | 1.01 |

Although the foregoing embodiments have been described with reference to a projection exposure apparatus for the manufacture of semiconductor devices, the present invention is similarly applicable also to any other optical instruments where unwanted diffraction light from a diffractive optical element reaches an image plane to produce an undesirable effect such as non-uniformness of exposure, for example.

Next, an embodiment of a device manufacturing method which uses a projection exposure apparatus as described above, will be explained.

Figure 28:
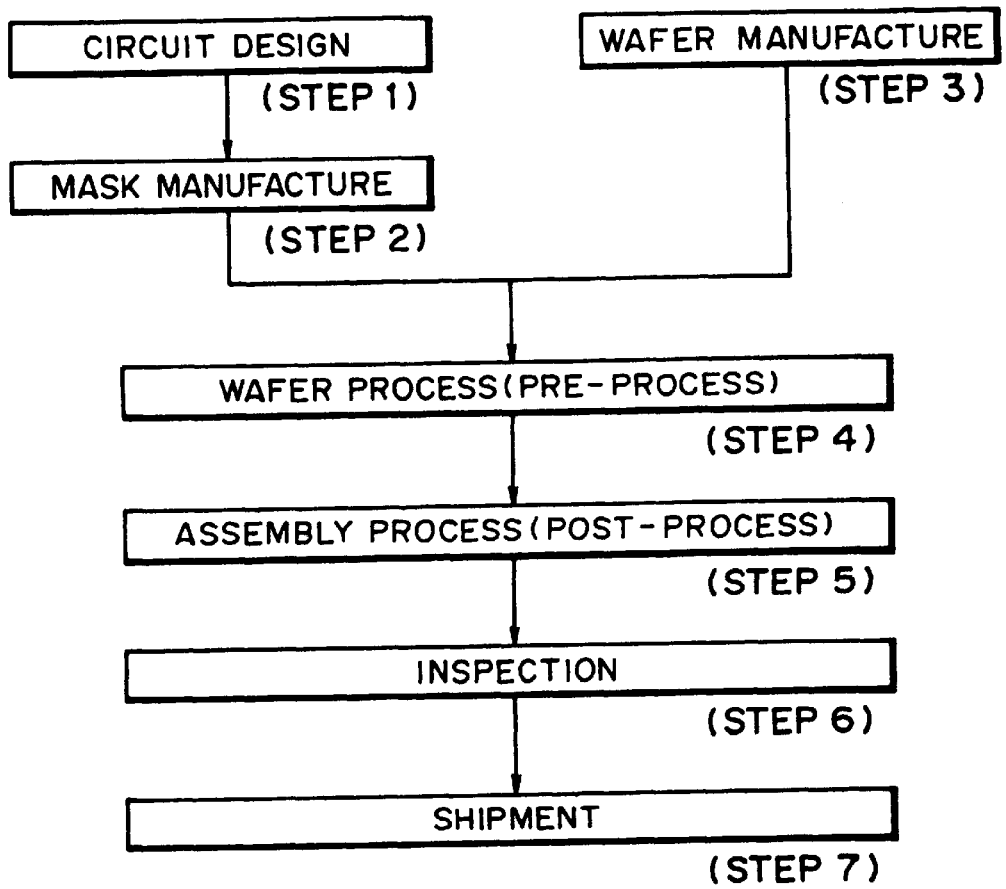
FIG. 28 is a flow chart of a device manufacturing method according to the present invention.

FIG. 28 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 29:
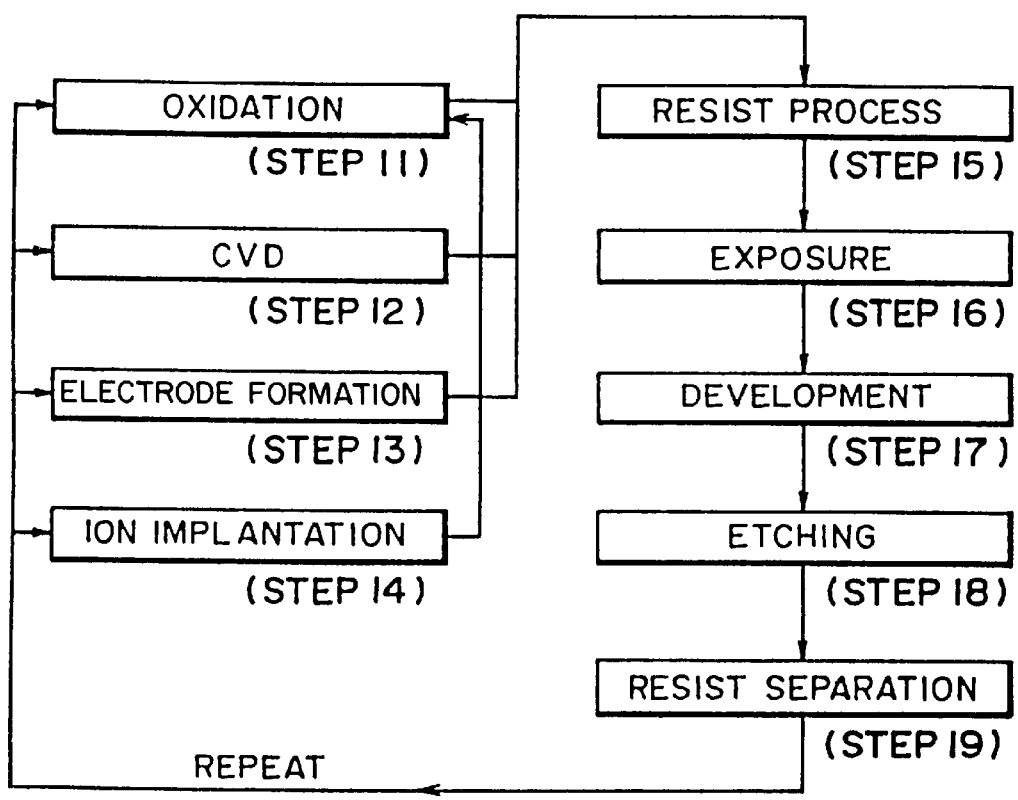
FIG. 29 is a flow chart of a wafer process according to the present invention.

FIG. 29 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   an illumination optical system for illuminating a mask with light from a light source; and
   a projection optical system having at least one diffractive optical element, for projecting an image of a pattern of the mask, as illuminated, onto a substrate, wherein said at least one diffractive optical element is adapted to produce first diffraction light of an order contributable for projecting the image and second diffraction light of an order different from that of the first diffraction light, wherein an intensity distribution, upon the substrate, of a portion of the second diffraction light to be superposed with the image of the pattern upon the substrate is substantially uniform.

2. An apparatus according to claim 1, wherein said diffractive optical element is disposed at or adjacent to the position of an aperture stop of said projection optical system.

3. An apparatus according to claim 2, wherein another portion of the second diffraction light is not to be projected onto the substrate but to be projected on an inside wall of a lens barrel for supporting said projection optical system.

4. An apparatus according to claim 2, wherein said projection optical system comprises a plurality of diffractive optical elements which are disposed at or adjacent to an aperture stop of said projection optical system, for producing the first and second diffraction lights.

5. A projection exposure apparatus, comprising:
   an illumination optical system for illuminating a mask with light from a light source; and
   a projection optical system having a plurality of lenses and at least one diffractive optical element, for projecting an image of a pattern of the mask, as illuminated, onto a substrate, wherein said diffractive optical element is adapted to produce first diffraction light of an order to be used for projection of the image and second diffraction light of an order different from that of the first diffraction light, and wherein an intensity distribution, upon the substrate, of a portion of the second diffraction light to be superposed with the image of the pattern upon the substrate is substantially uniform while another portion of the second diffraction light is not to be projected onto the substrate.

6. An apparatus according to claim 5, wherein said diffractive optical element is disposed at or adjacent to the position of an aperture stop of said projection optical system.

7. An apparatus according to claim 6, wherein said projection optical system comprises at least two diffractive optical elements disposed at or adjacent to an aperture stop of said projection optical system, for producing the first and second diffraction lights.

8. An apparatus according to claim 7, wherein, when the distance between the mask and the substrate is D, the distance from the position of the aperture stop to the position of an i-th diffractive optical element is $d_i$, and the height of a maximum light ray at the aperture stop position that determines the numerical aperture of said projection optical system and the incidence height thereof to the i-th diffractive optical element are H and $h_i$, respectively, the following relations are satisfied with respect to each diffractive optical element:

$$0.005 < d_i/D < 0.12$$

$$0.8 < h_i/H < 1.2,$$

wherein i is an integer.

9. An apparatus according to claim 7, wherein said plurality of lenses includes at least one aspherical lens.

10. An apparatus according to claim 7, wherein said diffractive optical element corrects axial chromatic aberration of said plurality of lenses, as well as coma of color.

11. An apparatus according to claim 7, wherein there are two diffractive optical elements and outermost gratings of said two diffractive optical elements have respective spatial frequencies $fR_1$ and $fR_2$ that satisfy the following relation:

$$0.4 \leq fR_1/fR_2 \leq 2.5.$$

12. An apparatus according to claim 7, wherein said apparatus includes a light source and the light source in selected from a group consisting of a KrF excimer laser, an ArF excimer laser and a $F_2$ laser.

13. An apparatus according to claim 7, wherein said projection optical system uses a glass material of quartz only.

14. An apparatus according to claim 7, wherein said projection optical system uses glass materials of quartz and fluorite only.

15. An apparatus according to claim 7, wherein the image of the pattern contains a line width not greater than 0.25 micron.

16. An apparatus according to claim 7, wherein the image of pattern is sequentially projected onto different portions of the substrate through a step-and-repeat process.

17. An apparatus according to claim 7, wherein the image of the pattern is sequentially projected onto different portions of the substrate through a step-and-scan process.

18. An apparatus according to claim 6, wherein the other portion of the second diffraction light, which is not to be projected onto the substrate is projected onto an inside wall of a lens barrel for supporting said projection optical system.

19. An apparatus according to claim 6, wherein, when the distance between the mask and the substrate is D, the distance from the position of the aperture stop to the position of said diffractive optical element is d, and the height of a maximum light ray at the aperture stop position that determines the numerical aperture of said projection optical system and the incidence height thereof to said diffractive optical element are H and h, respectively, the following relations are satisfied:

$$0.005 < d/D < 0.12$$

$$0.8 < h/H < 1.2.$$

20. An apparatus according to claim 6, wherein said plurality of lenses includes at least one aspherical lens.

21. A projection exposure apparatus for projecting a pattern of a first object onto a second object through a projection optical system, said projection optical system comprising:

first and second diffractive optical elements disposed at or adjacent to the position of an aperture stop; and at least one aspherical lens, wherein, when the distance from the aperture stop to the i-th diffractive optical element is $d_i$, the distance from the first object to the second object is D, and the height of maximum light height, at the aperture stop position, that determines the numerical aperture of said projection optical system and the incidence height thereof to the i-th diffractive optical element are H and $h_i$, respectively, the following relations are satisfied:

$$0.005 < d_i/D < 0.12$$

$$0.8 < h_i/H < 1.2,$$

wherein i is an integer.

22. A projection exposure apparatus for projecting a pattern of a first object onto a second object through a projection optical system, said apparatus comprising:

first and second diffractive optical elements disposed at or adjacent to the position of an aperture stop, wherein, when the distance from the aperture stop to the i-th diffractive optical element is $d_i$, the distance from the first object to the second object is D, and the height of maximum light height, at the aperture stop position, that determines the numerical aperture of said projection optical system and the incidence height thereof to the i-th diffractive optical element are H and $h_i$, respectively, the following relations are satisfied:

$$0.005 < d_i/D < 0.12$$

$$0.8 < h_i/H < 1.2 (i = \text{an integer}).$$

23. An apparatus according to claim 22, wherein said first and second diffractive optical elements are disposed on the opposite sides of the aperture stop.

24. An apparatus according to claim 23, wherein outermost gratings of said first and second diffractive optical elements have respective spatial frequencies $fR_1$ and $fR_2$ that satisfy the following relation:

$$0.4 \leq fR_1/fR_2 \leq 2.5.$$

25. An apparatus according to claim 22, wherein said first and second diffractive optical elements are disposed on a side of the aperture stop facing the first object.

26. An apparatus according to claim 22, wherein said first and second diffractive optical elements are disposed on a side of the aperture stop facing the second object.

27. An apparatus according to claim 22, wherein said first and second diffractive optical elements are set so that an intensity distribution, upon the second object, of a portion of the diffraction light not contributable to the projection, which portion is incident on a region of the second object where the pattern is projected, is uniform.

28. An apparatus according to claim 22, wherein said first and second diffractive optical elements are effective to correct axial chromatic aberration and color coma aberration of said projection optical system.

29. A projection exposure apparatus for projecting a pattern of a first object onto a second object through a projection optical system, said apparatus comprising:

first and second diffractive optical elements disposed on the opposite sides of an aperture stop, respectively, wherein said first and second diffractive optical elements are set so that an intensity distribution, upon the second object, of a portion of the diffraction light not contributable to the projection, which portion is incident on a region of the second object where the pattern is projected, is uniform.

30. A projection exposure apparatus for projecting a pattern of a first object onto a second object through a projection optical system, said apparatus comprising:

first and second diffractive optical elements disposed on the opposite sides of an aperture stop, respectively, wherein outermost gratings of said first and second diffractive optical elements have respective spatial frequencies $fR_1$ and $fR_2$ that satisfy the following relation:

$$0.4 \leq fR_1/fR_2 \leq 2.5.$$

31. A device manufacturing method comprising the steps of:

projecting a pattern of a reticle onto a wafer by use of a projection exposure apparatus as recited in any one of claims 29 or 30; and performing, after the pattern projection, a development process to the wafer.

* * * * *

UNITED STATES PATENT AND TRADEMARK OFFICE
CERTIFICATE OF CORRECTION

PATENT NO.  : 6,266,192 B1
DATED       : July 24, 2001
INVENTOR(S) : Yoshiyuki Sekine et al.

It is certified that error appears in the above-identified patent and that said Letters Patent is hereby corrected as shown below:

Title page,
Under "U.S. PATENT DOCUMENTS", the following should be added:

| | | | |
|---|---|---|---|
| -- 5,790,321 | 8/1998 | Goto | 359/742 |
| 5,636,000 | 6/1997 | Ushida, et al. | 355/30 |
| 5,623,365 | 4/1997 | Kuba | 359/569 |
| 5,555,479 | 9/1996 | Nakagiri | 359/355 |
| 5,268,790 | 12/1993 | Chen | 359/558 |
| 5,260,828 | 11/1993 | Londono, et al. | 359/565 |
| 5,257,133 | 10/1993 | Chen | 359/568 |
| 5,170,207 | 12/1992 | Tezuka, et al. | 355/53 |
| 5,151,823 | 9/1992 | Chen | 359/565 |
| 5,148,314 | 9/1992 | Chen | 359/642 |
| 4,936,665 | 6/1992 | Whitney | 350/451 |
| 4,895,790 | 1/1990 | Swanson, et al. | 430/321 -- |

Under "OTHER PUBLICATIONS",
Line 2, "Vol. 1354, International lens Design Conference (1990), pp." should read
-- Vol. 1354, International Lens Design Conference (1990), pp. --

Column 7,
Line 64, "$(\sqrt{r^2+f^2} - f)$" should read --$(\sqrt{r^2+f^2} - f)$--.

Column 8,
Line 6, "$(\sqrt{r^2+f^2} - f)$" should read --$(\sqrt{r^2+f^2} - f)$--.

Line 13, "$(\sqrt{r^2+f^2} - f)$" should read --$(\sqrt{r^2+f^2} - f)$--.

Line 59, "an" should be deleted; and
Line 64, "a" should read -- an --.

UNITED STATES PATENT AND TRADEMARK OFFICE
CERTIFICATE OF CORRECTION

PATENT NO. : 6,266,192 B1
DATED : July 24, 2001
INVENTOR(S) : Yoshiyuki Sekine et al.

It is certified that error appears in the above-identified patent and that said Letters Patent is hereby corrected as shown below:

Column 22,
Line 27, "in" should read -- is --;
Line 29, "a" should read -- an --.

Column 24,
Line 7, "29 or 30;" should read -- 1 to 30, --.

Signed and Sealed this

Twelfth Day of March, 2002

Attest:

JAMES E. ROGAN
*Attesting Officer*  *Director of the United States Patent and Trademark Office*